(12) United States Patent
Kim et al.

(10) Patent No.: US 10,741,629 B2
(45) Date of Patent: Aug. 11, 2020

(54) DISPLAY DEVICE AND MANUFACTURING METHOD THEREOF

(71) Applicant: SAMSUNG DISPLAY CO., LTD., Yongin-si (KR)

(72) Inventors: Hyoeng Ki Kim, Yongin-si (KR); Jun Hyuk Woo, Yongin-si (KR)

(73) Assignee: SAMSUNG DISPLAY CO., LTD., Yongin-Si, Gyeonggi-Do (KR)

(*) Notice: Subject to any disclaimer, the term of this patent is extended or adjusted under 35 U.S.C. 154(b) by 0 days.

(21) Appl. No.: 16/032,242

(22) Filed: Jul. 11, 2018

(65) Prior Publication Data

US 2019/0131375 A1    May 2, 2019

(30) Foreign Application Priority Data

Oct. 27, 2017 (KR) ........................ 10-2017-0141377

(51) Int. Cl.
  *H01L 27/32* (2006.01)
  *H01L 51/52* (2006.01)

(52) U.S. Cl.
  CPC ........ *H01L 27/3276* (2013.01); *H01L 27/323* (2013.01); *H01L 27/3246* (2013.01); *H01L 27/3258* (2013.01); *H01L 51/5281* (2013.01); *H01L 27/322* (2013.01); *H01L 27/3211* (2013.01); *H01L 2227/323* (2013.01)

(58) Field of Classification Search
  CPC ... H01L 27/323; H01L 27/3297; H01L 33/46; H01L 33/60
  See application file for complete search history.

(56) References Cited

U.S. PATENT DOCUMENTS

| 8,502,444 B2 | 8/2013 | Chu et al. |
| 8,624,868 B2 | 1/2014 | Chang et al. |
| 2003/0222311 A1* | 12/2003 | Kim ............... G02F 1/13454 257/347 |

(Continued)

FOREIGN PATENT DOCUMENTS

| KR | 10-2008-0057789 | 6/2008 |
| KR | 10-2016-0015815 | 2/2016 |
| KR | 10-1730609 | 4/2017 |

OTHER PUBLICATIONS

Extended European Search Report dated Mar. 19, 2019 in Corresponding European Patent Application No. 18195644.2.

*Primary Examiner* — George R Fourson, III
(74) *Attorney, Agent, or Firm* — F. Chan & Associates, LLC

(57) ABSTRACT

A display device includes a substrate including a display region and non-display region, and at least one pixel disposed in the display region. The at least one pixel includes an emission region that emits a light, a non-emission region that does not emit the light, a light emitting element disposed in the emission region, and a pixel circuit that drives the light emitting element. The display device further includes a passivation layer disposed between the pixel circuit and the light emitting element. The passivation layer covers the pixel circuit and includes a concave pattern disposed in the non-emission region. The display device further includes a power supply line disposed on the passivation layer in the non-emission region and connected to the light emitting element. The power supply line includes an uneven pattern corresponding to the concave pattern.

19 Claims, 25 Drawing Sheets

(56) References Cited

U.S. PATENT DOCUMENTS

| | | | |
|---|---|---|---|
| 2004/0141112 A1* | 7/2004 | Kang | G02F 1/133553 349/113 |
| 2004/0227877 A1* | 11/2004 | Jeong | G02F 1/1343 349/114 |
| 2006/0091399 A1* | 5/2006 | Lee | H01L 27/12 257/72 |
| 2008/0164810 A1* | 7/2008 | Oda | H01L 27/3246 313/504 |
| 2010/0080258 A1* | 4/2010 | Ikuta | H01S 5/18391 372/46.013 |
| 2011/0032460 A1* | 2/2011 | Lee | G02F 1/133555 349/114 |
| 2015/0102292 A1* | 4/2015 | Kim | H01L 27/3246 257/40 |
| 2017/0170248 A1 | 6/2017 | Sato | |
| 2017/0269749 A1* | 9/2017 | Bok | G02F 1/13338 |
| 2017/0278899 A1* | 9/2017 | Yang | H01L 51/0097 |
| 2018/0053918 A1* | 2/2018 | Woo | H01L 51/0096 |
| 2018/0077808 A1* | 3/2018 | Seo | G06F 3/044 |
| 2018/0284892 A1* | 10/2018 | Kwon | G06F 3/04817 |
| 2019/0286270 A1* | 9/2019 | Bok | G06F 3/044 |

\* cited by examiner

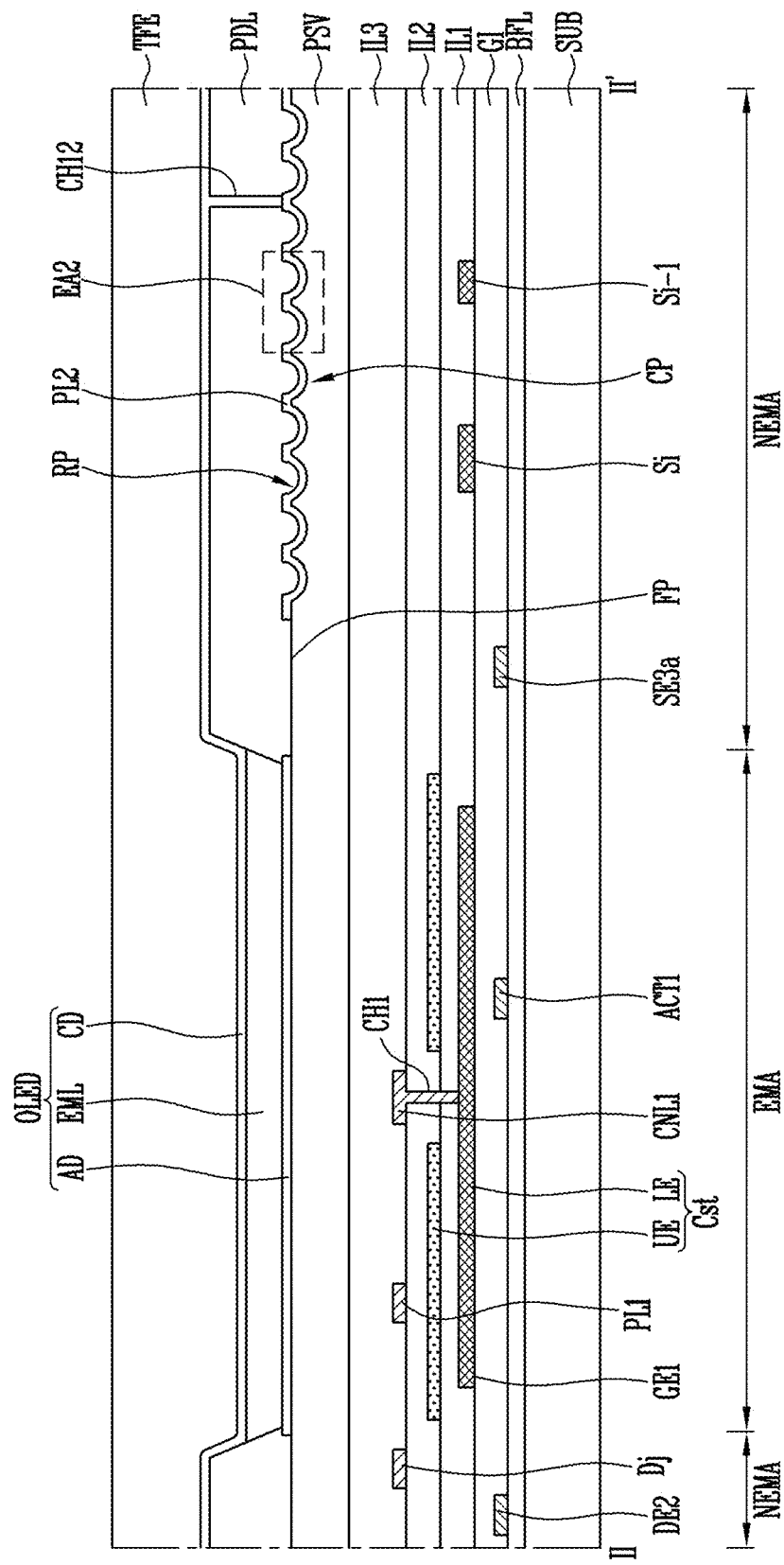

Comparative Example

Exemplary Embodiment

Comparative Example

Exemplary Embodiment

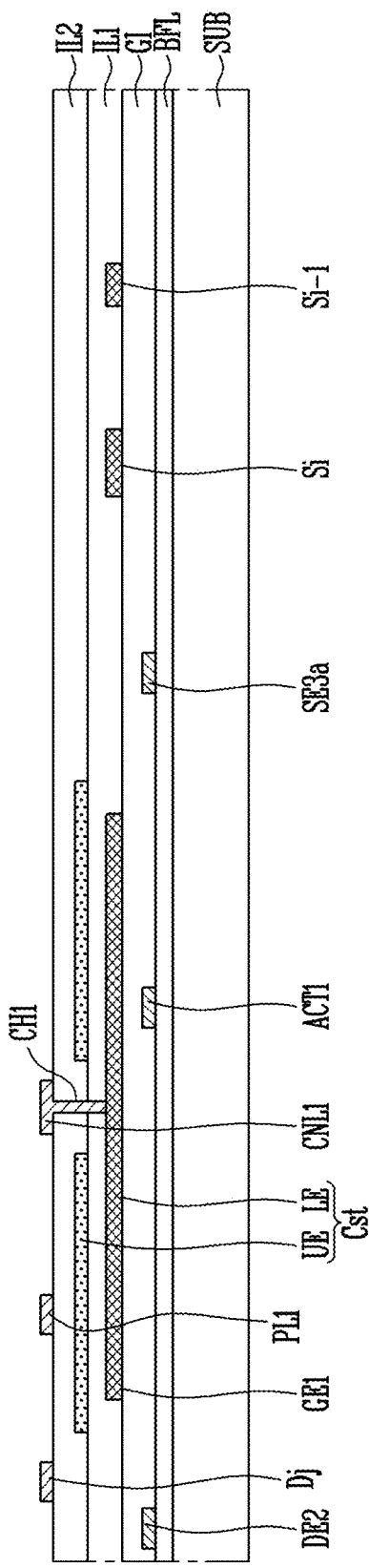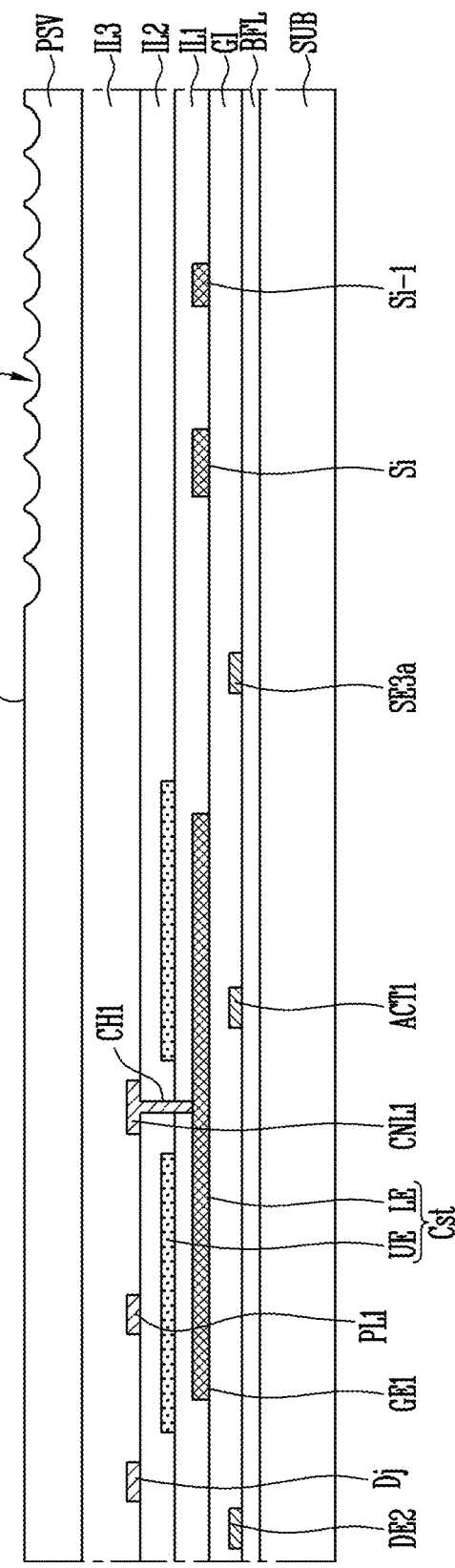

DISPLAY DEVICE AND MANUFACTURING METHOD THEREOF

CROSS-REFERENCE TO RELATED APPLICATIONS

This application claims priority under 35 U.S.C. § 119 to Korean Patent Application No. 10-2017-0141377 filed on Oct. 27, 2017, the disclosure of which is incorporated by reference herein in its entirety.

TECHNICAL FIELD

Exemplary embodiments of the present invention relate to a display device and a manufacturing method thereof.

DISCUSSION OF THE RELATED ART

Organic light emitting diode displays that use self-emission elements provide desirable display characteristics such as, for example, wide viewing angle, excellent contrast, fast response time, and excellent luminance.

Organic light emitting diode displays include organic light emitting diodes. In the organic light emitting diode, an electron injected from one electrode and a hole injected from another electrode are combined in an organic light emitting layer to form an exciton, which emits light while emitting energy.

SUMMARY

Exemplary embodiments of the present invention provide a display device with improved display quality, and a method of manufacturing the display device.

According to an exemplary embodiment of the present invention, a display device includes a substrate including a display region and non-display region, and at least one pixel disposed in the display region. The at least one pixel includes an emission region that emits a light, a non-emission region that does not emit the light, a light emitting element disposed in the emission region, and a pixel circuit that drives the light emitting element. The display device further includes a passivation layer disposed between the pixel circuit and the light emitting element. The passivation layer covers the pixel circuit and includes a concave pattern disposed in the non-emission region. The display device further includes a power supply line disposed on the passivation layer in the non-emission region and connected to the light emitting element. The power supply line includes an uneven pattern corresponding to the concave pattern.

In an exemplary embodiment, the light emitting element includes a first electrode disposed on the passivation layer in the emission region. The first electrode is electrically connected to the pixel circuit. The light emitting element further includes a pixel definition layer disposed on the first electrode. The pixel definition layer exposes a portion of the first electrode. The light emitting element further includes an emission layer disposed on the exposed first electrode, and a second electrode disposed on the emission layer.

In an exemplary embodiment, the power supply line is electrically connected to the second electrode through a via hole that passes through the pixel definition layer.

In an exemplary embodiment, the pixel circuit includes at least one transistor. The at least one transistor includes an active pattern disposed on the substrate, a source electrode and a drain electrode respectively connected to the active pattern, and a gate electrode disposed on the active pattern. A gate insulation layer is disposed between the gate electrode and the active pattern.

In an exemplary embodiment, the concave pattern has a recessed shape in a direction from one surface of the passivation layer to an opposite surface of the passivation layer under which the at least one transistor is disposed, and the uneven pattern has a shape corresponding to the concave pattern.

In an exemplary embodiment, a width of the concave pattern is between about 1.2 μm and about 2 μm, and a depth of the concave pattern is between about 0.3 μm and about 0.5 μm.

In an exemplary embodiment, the passivation layer includes a flat portion in the emission region.

In an exemplary embodiment, the uneven pattern causes an irregular reflection of an external light incident on the light emitting element.

According to an exemplary embodiment of the present invention, a display device includes a substrate including a display region and a non-display region disposed on at least one side of the display region, and at least one pixel disposed in the display region. The at least one pixel includes an emission region that emits a light, a non-emission region that does not emit the light, a light emitting element disposed in the emission region, and a pixel circuit that drives the light emitting element. The display device further includes a passivation layer disposed on the pixel circuit, a power supply line disposed on the passivation layer in the non-emission region and connected to the light emitting element, a thin film encapsulation layer disposed on the light emitting element, a touch sensor disposed on the thin film encapsulation layer, and a window disposed on the touch sensor. The power supply line includes an uneven pattern that causes an irregular reflection of an external light incident on the light emitting element.

In an exemplary embodiment, the uneven pattern has a recessed shape in a direction from one surface of the power supply line to an opposite surface of the power supply line under which the pixel circuit is disposed.

In an exemplary embodiment, the light emitting element includes a first electrode disposed on the passivation layer in the emission region. The first electrode is electrically connected to the pixel circuit. The light emitting element further includes a pixel definition layer disposed on the first electrode and exposing a portion of the first electrode, an emission layer disposed on the first electrode, and a second electrode disposed on the emission layer. The power supply line is electrically connected to the second electrode through a via hole that passes through the pixel definition layer.

In an exemplary embodiment, a width of the uneven pattern is between about 1.2 μm and about 2 μm.

In an exemplary embodiment, the passivation layer includes a flat portion disposed in the emission region, and a concave pattern disposed in the non-emission region and corresponding to the uneven pattern of the power supply line.

In an exemplary embodiment, the display device further includes a polarization film disposed between the touch sensor and the window.

In an exemplary embodiment, the display device further includes a color conversion layer disposed between the touch sensor and the window. The color conversion layer converts the light emitted from the light emitting element into a specific color of light.

In an exemplary embodiment, the color conversion layer includes a color filter disposed in the emission region, and a light blocking pattern disposed in the non-emission region.

According to an exemplary embodiment of the present invention, a method of manufacturing a display device includes forming a pixel circuit on a substrate. The pixel circuit includes at least one transistor. The method further includes forming a passivation layer on the pixel circuit. The passivation layer includes a through hole that exposes a portion of the pixel circuit, and a concave pattern disposed on the pixel circuit. The method further includes forming a first electrode connected to the at least one transistor, forming a power supply line spaced apart from the first electrode on the passivation layer, forming a pixel definition layer that exposes a portion of the first electrode on the first electrode and the power supply line, forming an emission layer that emits a light on the first exposed electrode, forming a second electrode on the emission layer, and forming a thin film encapsulation layer on the second electrode. The power supply line is disposed on the passivation layer in a non-emission region that excludes the emission layer, and includes an uneven pattern corresponding to the concave pattern of the passivation layer. The light is not emitted in the non-emission region.

In an exemplary embodiment, forming the passivation layer includes coating an insulating material layer on the pixel circuit, and exposing and developing a portion of the insulating material layer to form a through hole and the concave pattern simultaneously.

In an exemplary embodiment, the concave pattern has a recessed shape in a direction from one surface of the passivation layer to an opposite surface of the passivation layer under which the at least one transistor is disposed, and the uneven pattern has a shape corresponding to the concave pattern.

In an exemplary embodiment, a width of the concave pattern is between about 1.2 μm and about 2 μm, and a depth of the concave pattern is between about 0.3 μm and about 0.5 μm.

BRIEF DESCRIPTION OF THE DRAWINGS

The above and other features of the present invention will become more apparent by describing in detail exemplary embodiments thereof with reference to the accompanying drawings, in which:

FIG. 6 is a cross-sectional view taken along line II-II' of FIG. 4 according to an exemplary embodiment of the present invention.

FIGS. 10A to 10H are cross-sectional views sequentially showing a manufacturing method of a display device of FIG. 4 according to an exemplary embodiment of the present invention.

DETAILED DESCRIPTION OF THE EXEMPLARY EMBODIMENTS

Figure 1:
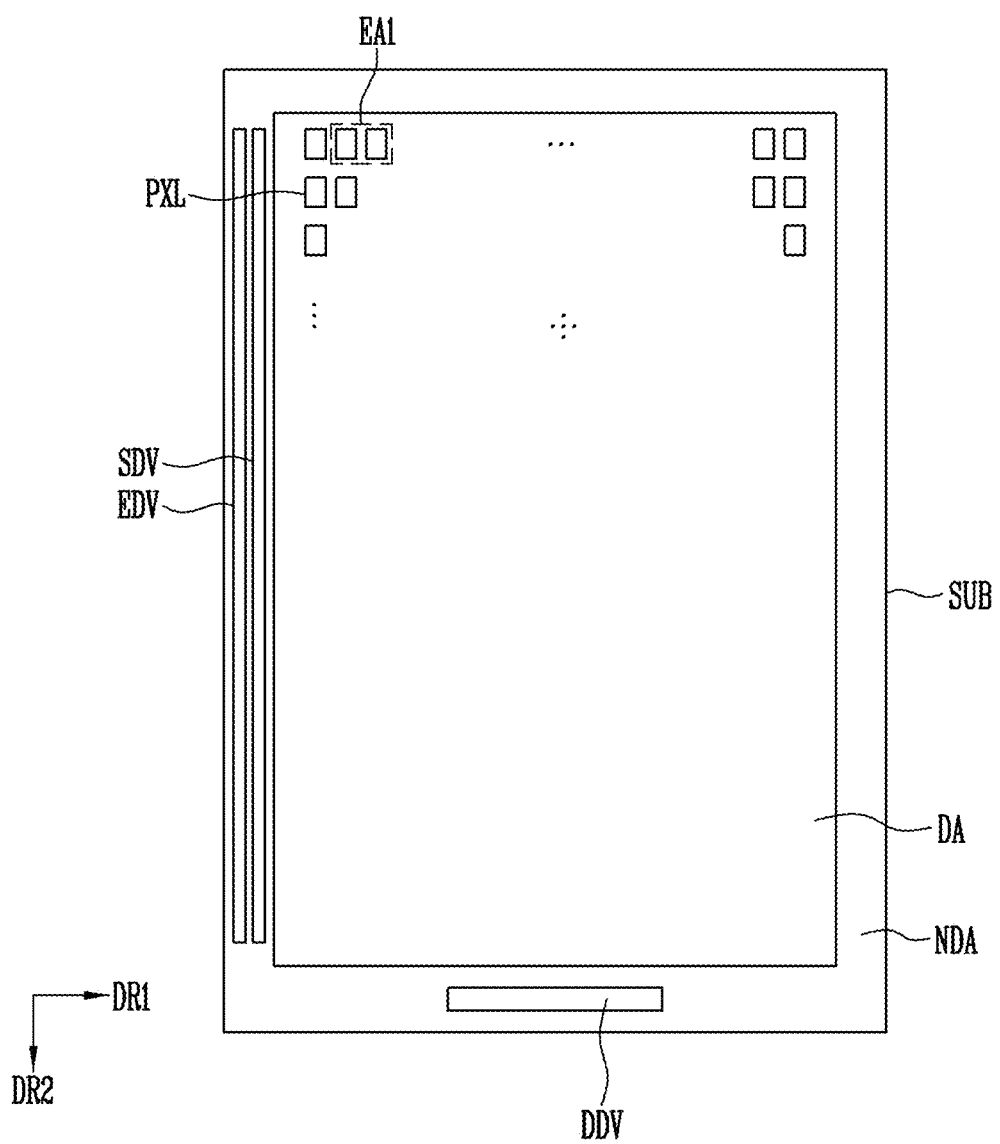
FIG. 1 is a plan view showing a display device according to an exemplary embodiment of the present invention.

Exemplary embodiments of the present invention will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment. As used herein, the singular forms "a", "an" and "the" are intended to include the plural forms as well, unless the context clearly indicates otherwise.

It will be further understood that when an element such as a layer, film, region, or substrate is referred to as being "on" another element, it can be directly on the other element or intervening elements may also be present. Further, it will be understood that when an element such as a layer, film, region, or substrate is referred to as being disposed "on" another element, the disposed direction is not limited to an upper direction and may include a side direction or a lower direction. Further, it will be understood that when an element such as a layer, film, region, or substrate is referred to as being "beneath" another element, it can be directly beneath the other element or intervening elements may also be present. Further, it will be understood that when an element such as a layer, film, region, or substrate is referred to as being "connected to", "coupled to", or "adjacent to" another element, it can be directly connected, coupled, or adjacent to the other element, or intervening elements may be present. It will also be understood that when an element is referred to as being "between" two elements, it can be the only element between the two elements, or one or more intervening elements may also be present. It will also be understood that when an element is referred to as "covering" another element, it can be the only element covering the other element, or one or more intervening elements may also be covering the other element.

It will be further understood that when one value is described as being about equal to another value, the values are equal to each other to within a measurement error, or if measurably unequal, are close enough in value to be functionally equal to each other as would be understood by a person having ordinary skill in the art.

FIG. 1 is a plan view illustrating a display device according to an exemplary embodiment of the present invention.

Referring to FIG. 1, a display device according to an exemplary embodiment of the present invention includes a substrate SUB, pixels PXL disposed on the substrate SUB, a driver disposed on the substrate SUB that drives the pixels PXL, and a line unit connecting the pixels PXL and the driver.

The substrate SUB may include a display region DA and a non-display region NDA. The display region DA is a region in which the pixels PXL that display an image are disposed. Each pixel PXL will be described in further detail below. The non-display region NDA is a region in which the driver that drives the pixels PXL and a portion of a line connecting the pixels PXL and the driver are disposed. The non-display region NDA corresponds to a bezel of a final display device. For example, a width of the bezel may be determined according to a width of the non-display region NDA.

The display region DA may have various shapes, and is not limited to the shape illustrated in FIG. 1. For example, the display region DA may have various shapes such as a closed polygon including sides that are straight lines, a circle, an ellipse including sides that are curved lines, a semicircle, a semi-ellipse including sides that are straight lines and curved lines, etc. When the display region DA includes a plurality of regions, each region may also be disposed in various shapes such as, for example, a closed polygon including sides that are straight lines, a semicircle, a semi-ellipse including sides that are curved lines, etc. In addition, areas of the plurality of regions may be the same as or different from each other.

In an exemplary embodiment of the present invention, a case in which the display region DA is provided as one region having a quadrangle shape including sides that are each a straight line will be described as an example.

The non-display region NDA may be provided on at least one side of the display region DA. In an exemplary embodiment of the present invention, the non-display region NDA may surround the display region DA. In exemplary embodiments, the non-display region NDA may entirely surround or partially surround the display region DA. In an exemplary embodiment of the present invention, the non-display region NDA may include a horizontal portion extending in the width direction and a vertical portion extending in the longitudinal direction. The vertical portion of the non-display region NDA may be provided as two portions spaced apart from each other along the width direction of the display region DA, with the display region DA disposed therebetween, as shown in FIG. 1.

The pixels PXL are disposed in the display region DA on the substrate SUB. Each pixel PXL refers to a minimum unit that displays an image. A plurality Of pixels PXL are disposed in the display region DA on the substrate SUB. The pixels PXL may include a light emitting element which emits white light and/or color light. For example, each pixel PXL may emit at least one of red, green, and blue colors. However, the pixels PXL are not limited thereto. For example, in an exemplary embodiment, each pixel PXL may emit at least one of cyan, magenta, yellow, and white colors.

The pixels PXL are arranged in a matrix form in rows extending in a first direction DR1 and columns extending in a second direction DR2 crossing the first direction DR1. However, an arrangement form of the pixels PXL is not particularly limited, and may be arranged in various forms. For example, in exemplary embodiments, a portion of the pixels PXL may be arranged such that the first direction DR1 is a row direction, and the other portion of the pixels PXL may be arranged such that a direction other than the first direction DR1, for example, a direction inclined to the first direction DR1, is a row direction. Alternatively, the pixels PXL may be arranged such that a direction inclined to the first direction DR1 and the second direction DR2 is a column direction, and a direction crossing the column direction is a row direction. Herein, the column direction may also be inclined to the first direction DR1 and the second direction DR2.

The driver may supply a signal to each pixel PXL through the line unit, thereby controlling the driving of the pixel PXL. For convenience of explanation, illustration of the line unit is omitted in FIG. 1. The line unit will be described in further detail below.

The driver may include a scan driver SDV that supplies a scan signal to the pixels PXL through a scan line, an emission driver EDV that supplies an emission control signal to the pixels PXL through an emission control line, a data driver DDV that supplies a data signal to the pixels PXL through a data line, and a timing controller. The timing controller may control the scan driver SDV, the emission driver EDV, and the data driver DDV.

The scan driver SDV may be disposed in the vertical portion of the non-display region NDA. The vertical portion of the non-display region NDA may be provided as two portions spaced apart from each other along the width direction of the display region DA, with the display region DA disposed therebetween. Thus, the vertical portion of the non-display region NDA includes a first portion disposed on one side of the display region DA and extending in the direction DR2, and a second portion disposed on an opposite side of the display region DA and extending in the direction DR2. The scan driver SDV may be disposed in at least one of the vertical portions of the non-display region NDA. The scan driver SDV may extend in the longitudinal direction of the non-display region NDA.

The emission driver EDV may also be disposed in a vertical portion of the non-display region NDA, similar to the scan driver SDV. The emission driver EDV may be disposed in at least one of the vertical portions of the non-display region NDA. The emission driver EDV may extend in the longitudinal direction of the non-display region NDA.

In an exemplary embodiment of the present invention, the scan driver SDV and the emission driver EDV are adjacent to each other and formed only at one of the vertical portions of the non-display region NDA (e.g., formed in the non-display region NDA on only one side of the display region DA). However, the present invention is not limited thereto, and the arrangement thereof may be changed in various ways. For example, in an exemplary embodiment, the scan driver SDV may be provided at one side of the vertical portion of the non-display region NDA, and the emission driver EDV may be provided at the other side of the vertical portion of the non-display region NDA. Alternatively, the scan driver SDV may be provided at both sides of the vertical portion of the non-display region NDA, and the emission driver EDV may be provided only at one side of the vertical portion of the non-display region NDA.

The data driver DDV may be disposed in the non-display region NDA. For example, the data driver DDV may be disposed in a horizontal portion of the non-display region NDA. The data driver DDV may extend in the width direction of the non-display region NDA. For example, the data driver DDV may extend lengthwise in the direction DR1.

In an exemplary embodiment of the present invention, the positions of the scan driver SDV, the emission driver EDV, and/or the data driver DDV may be changed.

The timing controller may be connected to the scan driver SDV, the emission driver EDV, and the data driver DDV through lines in various ways. The position of the timing controller is not particularly limited. For example, the timing controller may be mounted on a printed circuit board and may be connected to the scan driver SDV, the emission driver EDV, and the data driver DDV through a flexible printed circuit board. The printed circuit board may be disposed at various positions such as, for example, one side of the substrate SUB, a backside of the substrate SUB, etc.

FIG. 1 illustrates a region EA1, which will be described below with reference to FIG. 14.

Figure 2:
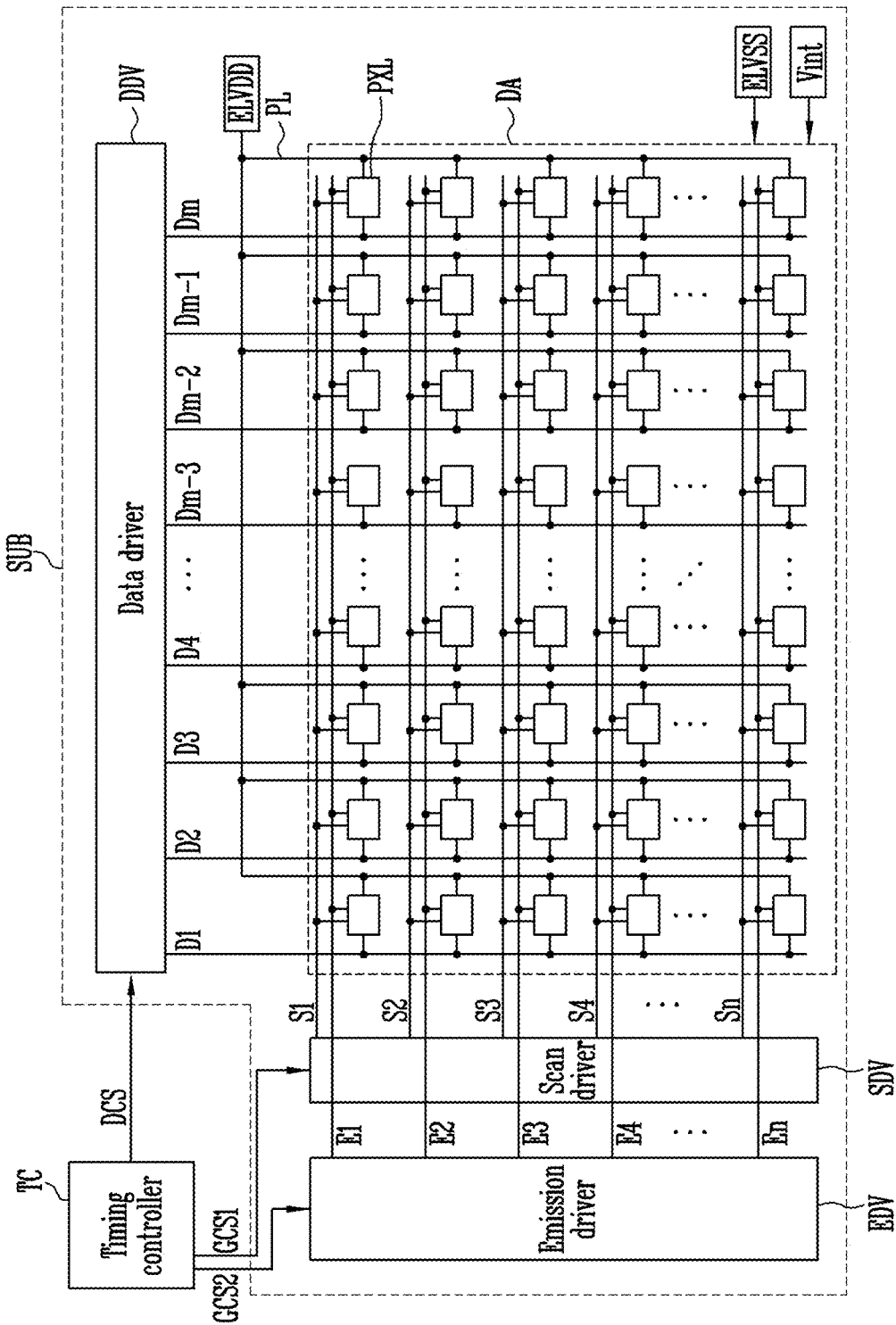
FIG. 2 is a block diagram showing an exemplary embodiment of pixels and a driver in a display device of FIG. 1.

FIG. 2 is a block diagram showing an exemplary embodiment of pixels and a driver in a display device of FIG. 1.

Referring to FIGS. 1 and 2, a display device according to an exemplary embodiment of the present invention includes pixels PXL, a driver and line unit.

The driver may include a scan driver SDV, an emission driver EDV, a data driver DDV, and a timing controller TC. It is to be understood that the positions of the scan driver SDV, the emission driver EDV, the data driver DDV, and the timing controller TC illustrated in FIG. 2 are exemplary, and that these components may be disposed at other position in the display device when implementing the display device according to exemplary embodiments of the present invention.

The line unit may include a scan line, a data line, an emission control line, a power supply line PL, and an initialization power supply line disposed in the display region DA to supply a signal to each pixel PXL from the driver. The scan line may include a plurality of scan lines S1 to Sn (where n is a natural number), the emission control line may include a plurality of emission control lines E1 to En, and the data lines may include a plurality of data lines D1 to Dm (where m is a natural number).

The pixels PXL are disposed in the display region DA. Each pixel PXL receives a data signal from a data line corresponding thereto when a scan signal is supplied from a scan line corresponding thereto. Each pixel PXL that receives the data signal may control a current amount flowing from the first power source ELVDD provided through the power supply line PL to the second power source ELVSS through a light emitting element.

The scan driver SDV supplies the scan signal to the scan lines S1 to Sn in response to the first gate control signal GCS1 received from the timing controller TC. For example, the scan driver SDV may sequentially supply the scan signal to the scan lines S1 to Sn. When the scan signal is sequentially supplied to the scan lines S1 to Sn, the pixels PXL may be sequentially selected in horizontal line units.

The emission driver EDV applies the emission control signal to the emission control lines E1 to En in response to the second gate control signal GCS2 received from the timing controller TC. For example, the emission controller EDV may sequentially supply the emission control signals to the emission control lines E1 to En.

In exemplary embodiments, the emission control signal is set to have a larger width than the scan signal. For example, the emission control signal supplied to the i-th emission control line Ei (where I is a natural number) may be supplied to overlap at least one portion of a scan signal supplied to the i−1-th scan line Si−1 and a scan signal supplied to the i-th scan line Si. In addition, the emission control signal may be set to a gate-off voltage (e.g., a high voltage) so that the transistor included in the pixels PXL is turned off, and the scan signal may be set to a gate-on voltage (e.g., a low voltage) so that the transistor included in the pixels PXL is turned on.

The data driver DDV supplies the data signal to the data lines D1 to Dm in response to a data control signal DCS received from the timing controller TC. The data signal supplied to the data lines D1 to Dm may be supplied to the pixels PXL selected by the scan signal.

The timing controller TC supplies the gate control signals GCS1 and GCS2 based on timing signals supplied from outside of the display device to the scan driver SDV and the emission driver EDV, and supplies the data control signal DCS to the data driver DDV.

Each of the gate control signals GCS1 and GCS2 may include, for example, a start pulse and clock signals. The start pulse controls the timing of the first scan signal or the first emission control signal. The clock signals are used to shift the start pulse.

The data control signal DCS may include, for example, a source start pulse and clock signals. The source start pulse is used to control the sampling start time of the data, and the clock signals are used to control the sampling operation.

Figure 3:
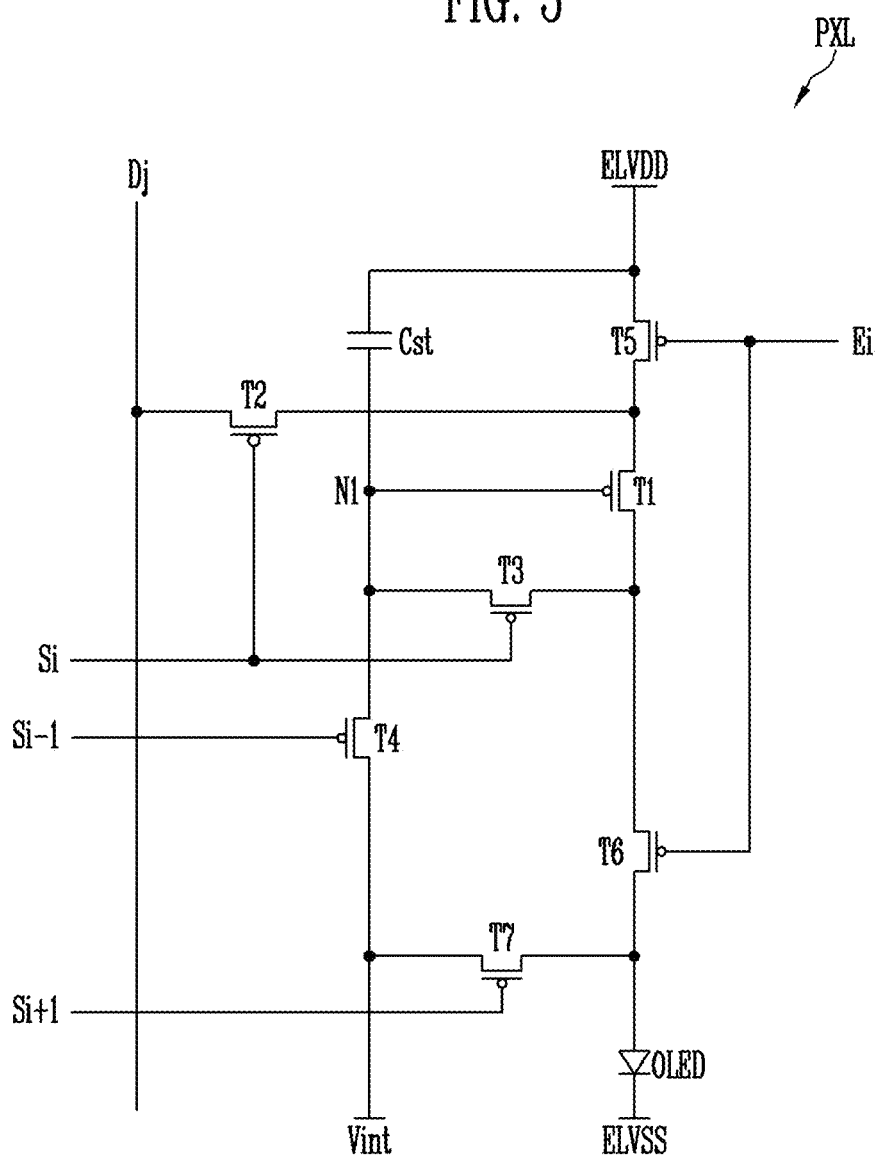
FIG. 3 is an equivalent circuit diagram showing one pixel of the pixels shown in FIG. 2 according to an exemplary embodiment of the present invention.

FIG. 3 is an equivalent circuit diagram showing one pixel of the pixels shown in FIG. 2 according to an exemplary embodiment of the present invention.

For convenience of explanation, FIG. 3 shows one pixel connected to the j-th data line Dj (where j is a natural number), the i−1-th scan line Si−1, the i-th scan line Si, and the i+1-th scan line Si+. Other pixels from among the plurality of pixels PX may include a similar configuration to the configuration shown in FIG. 3.

Referring to FIGS. 2 and 3, the pixel PXL according to an exemplary embodiment of the present invention includes a light emitting element OLED, first to seventh transistors T1 to T7, and a storage capacitor Cst. Referring to FIG. 3, the components other than the light emitting element OLED, including the first to seventh transistors T1 to T7, drive the light emitting element OLED. These components that drive the light emitting element OLED may be collectively referred to herein as a pixel circuit.

In an exemplary embodiment, an anode electrode of the light emitting element OLED is connected to the first transistor T1 via the sixth transistor T6, and a cathode electrode of the light emitting element OLED is connected to the second power source ELVSS. The light emitting element OLED may generate light having a predetermined luminance corresponding to a current amount supplied from the first transistor T1. The first power source ELVDD supplied to the power supply line PL may be set to a higher voltage than the second power source ELVSS so that current may flow through the light emitting element OLED.

A source electrode of the first transistor T1 (e.g., a driving transistor) is connected to the first power source ELVDD via the fifth transistor T5, and a drain electrode of the first transistor T1 is connected to the anode electrode of the light emitting element OLED via the sixth transistor T6. The first transistor T1 controls the current amount flowing from the first power source ELVDD to the second power source ELVSS via the light emitting element OLED corresponding to the voltage of the first node N1, which is a gate electrode thereof.

The second transistor T2 (e.g., a switching transistor) is connected between the j-th data line Dj and the source electrode of the first transistor T1. The gate electrode of the second transistor T2 is connected to the i-th scan line Si. When a scan signal is supplied to the i-th scan line Si, the second transistor T2 is turned on to electrically connect the j-th data line Dj to the source electrode of the first transistor T1.

The third transistor T3 is connected between the drain electrode of the first transistor T1 and the first node N1. A gate electrode of the third transistor T3 is connected to the i-th scan line Si. When a scan signal is supplied to the i-th scan line Si, the third transistor T3 is turned on to electrically connect the drain electrode of the first transistor T1 to the first node N1. Therefore, when the third transistor T3 is turned on, the first transistor T1 is connected in a diode form.

The fourth transistor T4 is connected between the first node N1 and the initialization power supply Vint. A gate electrode of the fourth transistor T4 is connected to the i−1-th scan line Si−1. When a scan signal is supplied to the i−1-th scan line Si−1, the fourth transistor T4 is turned on to supply the voltage of the initialization power supply Vint to the first node N1. Herein, the initialization power supply Vint is set to a lower voltage than the data signal.

The fifth transistor T5 is connected between the first power source ELVDD and the source electrode of the first transistor T1. A gate electrode of the fifth transistor T5 is connected to the i-th emission control line Ei. The fifth transistor T5 is turned off when the emission control signal is supplied to the i-th emission control line Ei, and is turned on in other cases.

The sixth transistor T6 is connected between the drain electrode of the first transistor T1 and the anode electrode of the light emitting element OLED. A gate electrode of the sixth transistor T6 is connected to the i-th emission control line Ei. The sixth transistor T6 is turned off when the emission control signal is supplied to the i-th emission control line Ei, and is turned on in other cases.

The seventh transistor T7 is connected between the initialization power supply Vint and the anode electrode of the light emitting element OLED, for example, between the initialization power supply Vint and the second node. A gate electrode of the seventh transistor T7 is connected to the i+1-th scan line Si+1. When a scan signal is supplied to the i+1-th scan line Si+1, the seventh transistor T7 is turned on to supply the voltage of the initialization power supply Vint to the anode electrode of the light emitting element OLED.

The storage capacitor Cst is connected between the first power source ELVDD and the first node N1. The storage capacitor Cst stores a voltage corresponding to the data signal and the threshold voltage of the first transistor T1.

Figure 4:
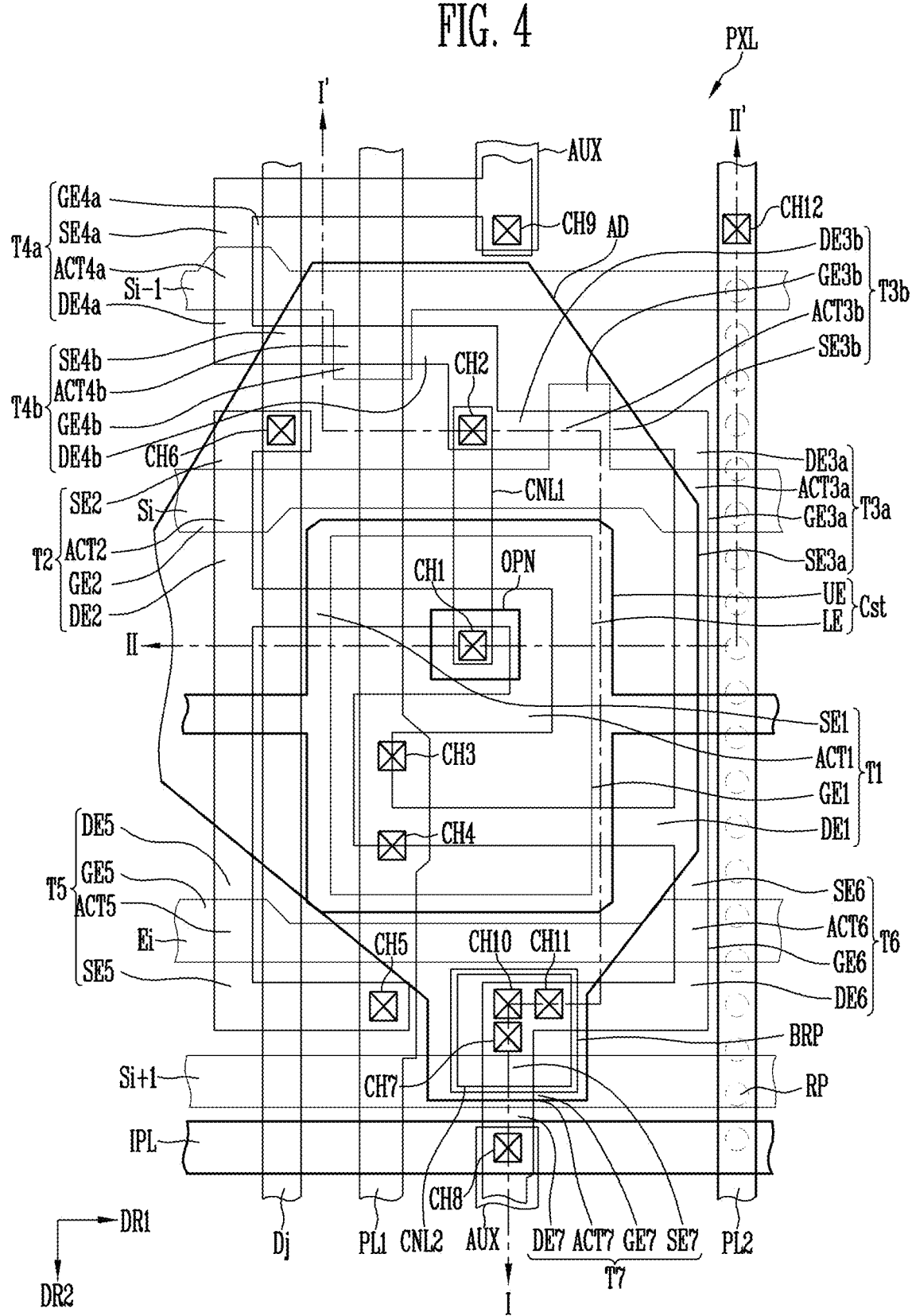
FIG. 4 is a plan view showing the one pixel shown in FIG. 3 in further detail according to an exemplary embodiment of the present invention.
Figure 5:
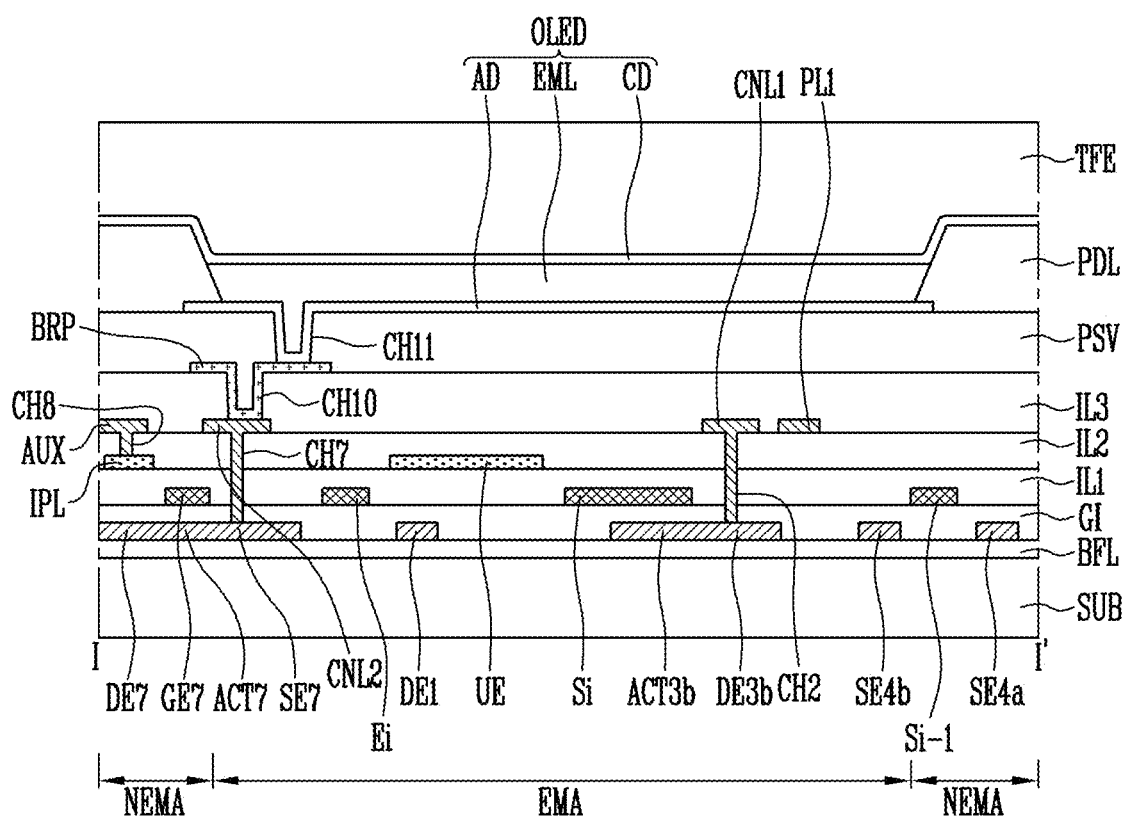
FIG. 5 is a cross-sectional view taken along line I-I' of FIG. 4 according to an exemplary embodiment of the present invention.
Figure 7A:
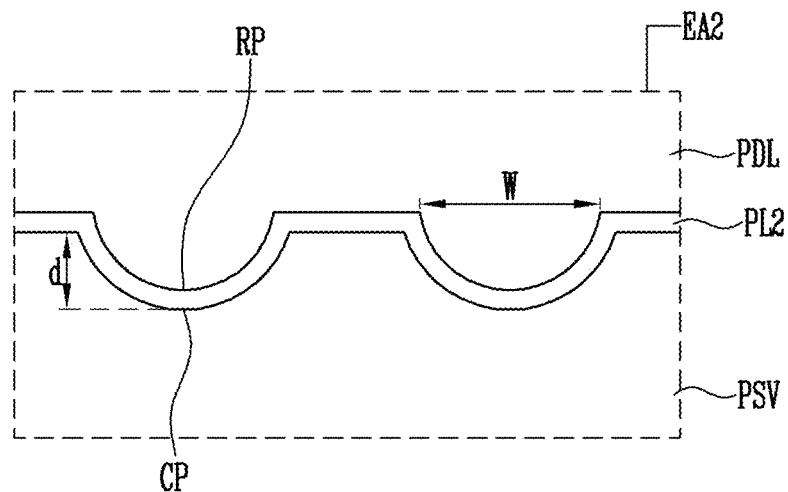
FIG. 7A is an enlarged view of region EA2 in FIG. 6 according to an exemplary embodiment of the present invention.
Figure 7B:
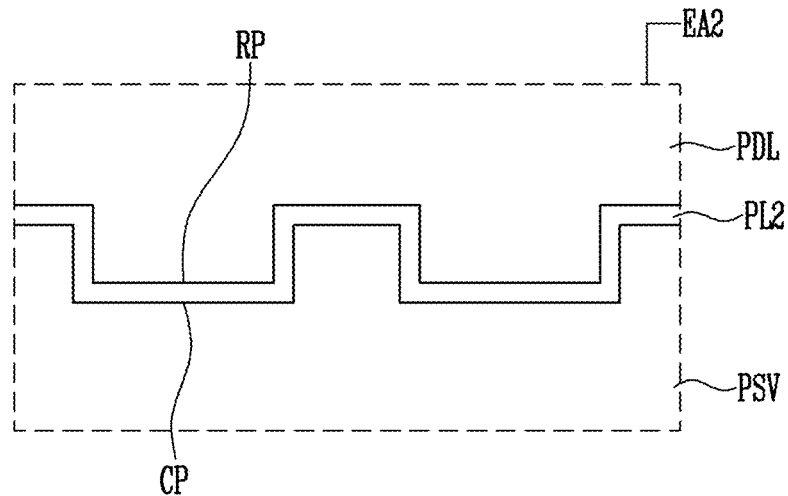
FIG. 7B is an enlarged view of region EA2 in FIG. 6 according to an exemplary embodiment of the present invention.
Figure 8A:
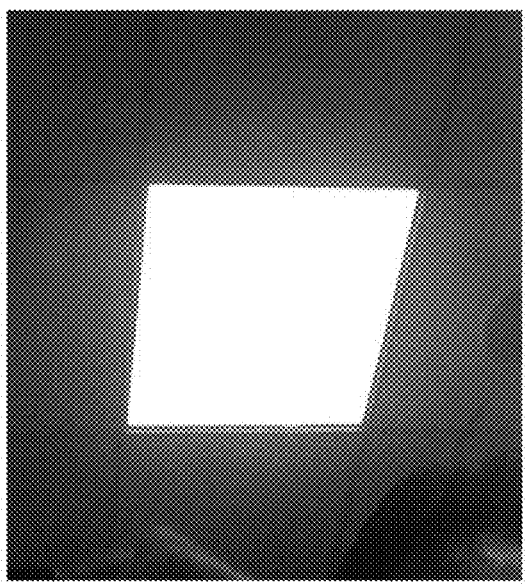
FIG. 8A is an image showing the external-light reflectance of a display device according to a comparative example.
Figure 8B:
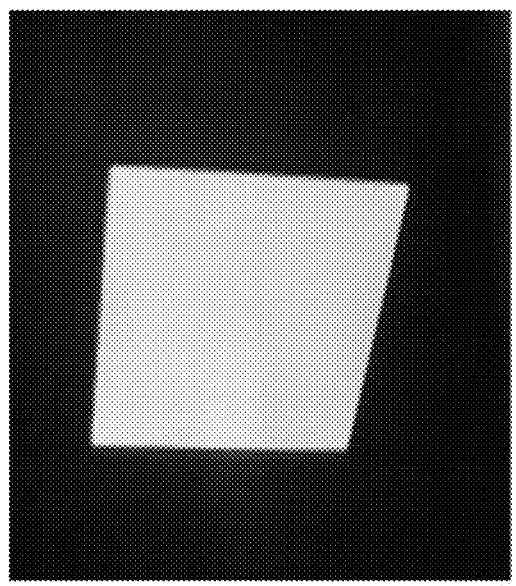
FIG. 8B is an image showing the external-light reflectance of a display device according to an exemplary embodiment of the present invention.
Figure 9A:
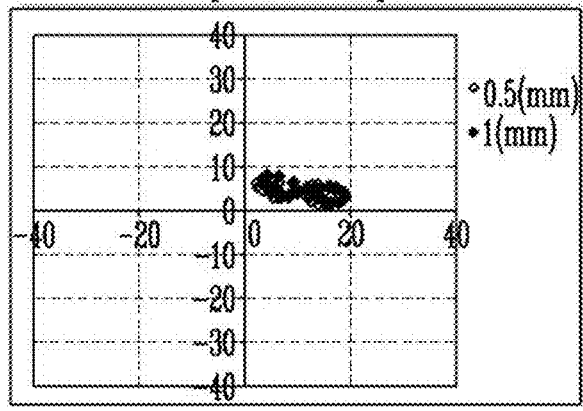
FIG. 9A is a graph showing the chrominance of a display device according to a comparative example.
Figure 9B:
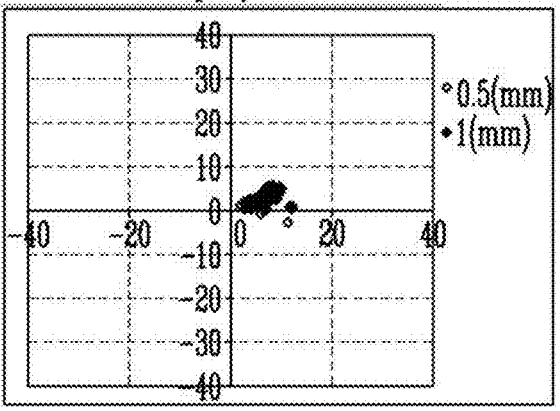
FIG. 9B is a graph showing the chrominance of a display device according to an exemplary embodiment of the present invention.

FIG. 4 is a plan view showing the one pixel shown in FIG. 3 in further detail according to an exemplary embodiment of the present invention. FIG. 5 is a cross-sectional view taken along line I-I' of FIG. 4 according to an exemplary embodiment of the present invention. FIG. 6 is a cross-sectional view taken along line II-II' of FIG. 4 according to an exemplary embodiment of the present invention. FIG. 7A is an enlarged view of region EA2 in FIG. 6 according to an exemplary embodiment of the present invention. The exemplary embodiment shown in FIG. 7A includes a concave pattern. FIG. 7B is an enlarged view of region EA2 in FIG. 6 according to an exemplary embodiment of the present invention. The exemplary embodiment of FIG. 7B includes an uneven pattern. FIG. 8A is an image showing the external-light reflectance of a display device according to a comparative example. FIG. 8B is an image showing the external-light reflectance of a display device according to an exemplary embodiment of the present invention. FIG. 9A is a graph showing the chrominance of a display device according to a comparative example. FIG. 9B is a graph showing the chrominance of a display device according to an exemplary embodiment of the present invention.

On the basis of one pixel PXL disposed in the i-th row and the j-th column of the display region DA, FIGS. 4 to 6 show three scan lines Si−1, Si and Si+1, an emission control line Ei, the first and second power supply lines PL1 and PL2, and data line Dj connected to the one pixel PXL.

In FIGS. 4 to 6, for convenience of explanation, the scan line of the i−1-th row is referred to as "the i−1-th scan line Si−1", the scan line of the i-th row is referred to as "the i-th scan line Si", the scan line of the i+1-th row is referred to as "the i+1-th scan line Si+1", the emission control line of the i-th row is referred to as "an emission control line Ei", the data line of the j-th column is referred to as "a data line Dj", the power supply line of the j-th column through which the first power source is supplied is referred to as "the first power supply line PL", and the power supply line of the j-th column through which the second power source is supplied is referred to as "the second power supply line PL2".

Referring to FIGS. 3 to 6, 7A, 7B, 8A, 8B, 9A, and 9B, a display device according to an exemplary embodiment of the present invention includes a substrate SUB, a line unit, and the pixel PXL.

The substrate SUB may include a transparent insulating material that allows for light to be transmitted. In addition, the substrate SUB may be a rigid substrate or a flexible substrate. The rigid substrate may include, for example, a glass substrate, a quartz substrate, a glass ceramic substrate, or a crystalline glass substrate. The flexible substrate may include, for example, a film substrate or a plastic substrate including a polymeric organic material. For example, the flexible substrate may be one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the flexible substrate may include fiberglass reinforced plastic (FRP).

The material to be applied to the substrate SUB may have resistance (e.g., heat resistance) against a high processing temperature in the manufacturing process of the display device. In an exemplary embodiment of the present invention, the substrate SUB may be entirely or partially flexible.

The line unit may transmit a signal to the pixel PXL, and may include a scan line Si−1, Si, Si+1, a data line Dj, an emission control line Ei, the first and second power supply lines PL1 and an initialization power supply line IPL.

The scan lines Si−1, Si, and Si+1 may extend in the first direction DR1. The scan lines Si−1, Si and Si+1 may include the i−1-th scan line Si−1, the i-th scan line Si, and the i+1-th scan line Si+1, sequentially arranged in the second direction DR2 crossing the first direction DR1. A scan signal may be supplied to the scan lines Si−1, Si, and Si+1. For example, the i−1-th scan signal may be supplied to the i−1-th scan line Si−1, the i-th scan signal may be supplied to the i-th scan line Si, and the i+1-th scan signal may be supplied to the i+1-th scan line Si+1.

In an exemplary embodiment of the present invention, three scan lines Si−1, Si, Si+1 are shown for supplying the scan signal to the pixel PXL. However, the present invention is not limited thereto. For example, the scan signal may be supplied to the pixel PXL through two scan lines Si−1 and Si. In this case, the i-th scan line Si of the two scan lines Si−1 and Si may be branched into two lines, and the branched i-th scan lines Si may be connected to different transistors. For example, the i-th scan line Si may include an upper i-th scan line adjacent to the i−1-th scan line Si−1 and a lower i-th scan line which is farther from the i−1-th scan line Si−1 than the upper i-th scan line.

The emission control line Ei extends in the first direction DR1, is disposed between the i-th scan line Si and the i+1-th scan line Si+1, and is spaced apart from the i-th scan line Si and the i+1-th scan line Si+1. An emission control signal is supplied to the emission control line Ei.

The data line Dj extend in the second direction DR2 and are sequentially arranged in the first direction DR1. A data signal may be supplied to the data line Dj.

The first power supply line PL1 extends in the second direction DR2 and is spaced apart from the data line Dj. The first power source ELVDD may be supplied to the first power supply line PL1.

The second power supply line PL2 extends in the second direction DR2 and is spaced apart from the first power supply line PL1. The second power source ELVSS may be supplied to the second power supply line PL2. In an exemplary embodiment of the present invention, the first power source EVLDD may be set to a higher voltage than the second power source EVLSS. In an exemplary embodiment, the second power supply line PL2 includes at least one uneven pattern RP. The uneven pattern RP will be described in detail below with reference to FIG. 6.

The initialization power supply line IPL extends in the first direction DR1. The initialization power supply line IPL may be disposed between the i+1-th scan line Si+1 and the i−1-th scan line Si−1 of the pixel in the next row. An initialization power supply Vint may be supplied to the initialization power supply line IPL.

The pixel PXL may include the first to seventh transistors T1 to T7, a storage capacitor Cst, and a light emitting element OLED, as described above with reference to FIG. 3.

The first transistor T1 includes the first gate electrode GE1, the first active pattern ACT1, the first source electrode SE1, the first drain electrode DE1, and the first connection line CNL1.

The first gate electrode GE1 may be connected to both the third drain electrode DE3 of the third transistor T3 and the fourth drain electrode DE4 of the fourth transistor T4. The first connection line CNL1 may connect components from among the first gate electrode GE1, the third drain electrode DE3, and the fourth drain electrode DE4. One end of the first connection line CNL1 may be connected to the first gate electrode GE1 through the first contact hole CH1, and the other end thereof may be connected to both the third drain electrode DE3 and the fourth drain electrode DE4 through the second contact hole CH2.

In an exemplary embodiment of the present invention, the first active pattern ACT1, the first source electrode SE1, and the first drain electrode DE1 may be formed of a semiconductor layer that is not doped with impurity or that is doped with impurity. For example, the first source electrode SE1 and the first drain electrode DE1 may be formed of a semiconductor layer doped with impurity, and the first active pattern ACT1 may be formed of a semiconductor layer that is not doped with impurity.

The first active pattern ACT1 has a bar shape extending in a predetermined direction, and may have a shape bent multiple times in the extended longitudinal direction. The first active pattern ACT1 may overlap the first gate electrode GE1 in a plane view. Since the first active pattern ACT1 is formed long, a channel region of the first transistor T1 may be formed long. Accordingly, a driving range of a gate voltage supplied to the first transistor T1 is widened. Therefore, a gray scale of light emitted from the organic light emitting element OLED may be finely controlled.

The first source electrode SE1 may be connected to one end of the first active pattern ACT1. In addition, the first source electrode SE1 may be connected to the second drain electrode DE2 of the second transistor T2 and the fifth drain electrode DE5 of the fifth transistor T5. The first drain electrode DE1 may be connected to the other end of the first active pattern ACT1. In addition, the first drain electrode DE1 may be connected to the third source electrode SE3 of the third transistor T3 and the sixth source electrode SE6 of the sixth transistor T6.

The second transistor T2 may include the second gate electrode GE2, the second active pattern ACT2, the second source electrode SE2, and the second drain electrode DE2.

The second gate electrode GE2 may be connected to the i-th scan line Si. The second gate electrode GE2 may be disposed in a portion of the i-th scan line Si or in a shape protruding from the i-th scan line Si (e.g., in an extension portion of the i-th scan line Si protruding from the main portion of the i-th scan line Si).

In an exemplary embodiment of the present invention, the second active pattern ACT2, the second source electrode SE2, and the second drain electrode DE2 may be formed of a semiconductor layer that is not doped with impurity or that is doped with impurity. For example, the second source electrode SE2 and the second drain electrode DE2 may be formed of a semiconductor layer doped with impurity, and the second active pattern ACT2 may be a semiconductor layer that is not doped with impurity.

The second active pattern ACT2 corresponds to a portion overlapping the second gate electrode GE2. One end of the second source electrode SE2 is connected to the second active pattern ACT2, and the other end thereof is connected to the data line Dj through the sixth contact hole CH6. One end of the second drain electrode DE2 is connected to the second active pattern ACT2, and the other end thereof is connected to the first source electrode SE1 of the first transistor T1 and the fifth drain electrode DE5 of the fifth transistor T5.

The third transistor T3 may have a double gate structure to prevent or reduce a leakage current. For example, the third transistor T3 may include a third-a transistor T3a and a third-b transistor T3b. The third-a transistor T3a may include a third-a gate electrode GE3a, a third-a active pattern ACT3a, a third-a source electrode SE3a, and a third-a drain electrode DE3a. The third-b transistor T3b may include a third-b gate electrode GE3b, a third-b active pattern ACT3b, a third-b source electrode SE3b, and a third-b drain electrode DE3b. For convenience of explanation, the third-a gate electrode GE3a and the third-b gate electrode GE3b may be referred to herein as the third gate electrode GE3, the third-a active pattern ACT3a and the third-b active pattern ACT3b may be referred to herein as the third active pattern ACT3, the third-a source electrode SE3a and the third-b source electrode SE3b may be referred to herein as the third source electrode SE3, and the third-a drain electrode DE3a and the third-b drain electrode DE3b may be referred to herein as the third drain electrode DE3.

The third gate electrode GE3 may be connected to the i-th scan line Si. The third gate electrode GE3 is disposed in a portion of the i-th scan line Si or in a shape protruding from the i-th scan line Si (e.g., in an extension portion of the i-th scan line Si protruding from the main portion of the i-th scan line Si).

The third active pattern ACT3, the third source electrode SE3, and the third drain electrode DE3 may be formed of a semiconductor layer that is not doped with impurity or that is doped with impurity. For example, the third source electrode SE3 and the third drain electrode DE3 may be formed of a semiconductor layer doped with impurity, and the third active pattern ACT3 may be formed of a semiconductor layer that is not doped with impurity. The third active pattern ACT3 corresponds to a portion overlapping the third gate electrode GE3.

One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. In addition, the third drain electrode DE3 may be connected to the first gate electrode GE1 of the first transistor T1 through the first connection line CNL1, the second contact hole CH2, and the first contact hole CH1.

The fourth transistor T4 may have a double gate structure to prevent or reduce a leakage current. For example, the fourth transistor T4 may include a fourth-a transistor T4a and a fourth-b transistor T4b. The fourth-a transistor T4a may include a fourth-a gate electrode GE4a, a fourth-a active pattern ACT4a, a fourth-a source electrode SE4a, and a fourth-a drain electrode DE4a. The fourth-b transistor T4b may include a fourth-b gate electrode GE4b, a fourth-b active pattern ACT4b, a fourth-b source electrode SE4b, and a fourth-b drain electrode DE4b. For convenience of explanation, the fourth-a gate electrode GE4a and the fourth-b gate electrode GE4b may be referred to herein as the fourth gate electrode GE4, the fourth-a active pattern ACT4a and the fourth-b active pattern ACT4b may be referred to herein as the fourth active pattern ACT4, the fourth-a source electrode SE4a and the fourth-b source electrode SE4b may be referred to herein as the fourth source electrode SE4, and the fourth-a drain electrode DE4a and the fourth-b drain electrode DE4b may be referred to herein as the fourth drain electrode DE4.

The fourth gate electrode GE4 may be connected to the i−1-th scan line Si−1. The fourth gate electrode GE4 may be disposed in a portion of the i−1-th scan line Si−1 or in a shape protruding from the i−1-th scan line Si−1 (e.g., in an extension portion of the i−1-th scan line Si−1 protruding from the main portion of the i−1-th scan line Si−1).

The fourth active pattern ACT4, the fourth source electrode SE4, and the fourth drain electrode DE4 may be formed of a semiconductor layer that is not doped with impurity or that is doped with impurity. For example, the fourth source electrode SE4 and the fourth drain electrode DE4 may be formed of a semiconductor layer doped with impurity, and the fourth active pattern ACT4 may be formed of a semiconductor layer that is not doped with impurity. The fourth active pattern ACT4 corresponds to a portion overlapping the fourth gate electrode GE4.

One end of the fourth source electrode SE4 may be connected to the fourth active pattern ACT4. The other end of the fourth source electrode SE4 may be connected to the initialization power supply line IPL of the pixel PXL in the i−1-th row and the seventh drain electrode DE7 of the seventh transistor T7 of the pixel PXL in the i−1-th row. An auxiliary connection line AUX may be disposed between the fourth source electrode SE4 and the initialization power supply line IPL. One end of the auxiliary connection line AUX may be connected to the fourth source electrode SE4 through the ninth contact hole CH9. The other end of the auxiliary connection line AUX may be connected to the initialization power supply line IPL of the pixel PXL in the i−1-th row through the eighth contact hole CH8 of the pixel PXL in the i−1-th row. One end of the fourth drain electrode DE4 may be connected to the fourth active pattern ACT4. The other end of the fourth drain electrode DE4 may be connected to the third drain electrode DE3 of the third transistor T3. The fourth drain electrode DE4 is also connected to the first gate electrode GE1 of the first transistor T1 through the first connection line CNL1, the second contact hole CH2, and the first contact hole CH1.

The fifth transistor T5 may include the fifth gate electrode GE5, the fifth active pattern ACT5, the fifth source electrode SE5, and the fifth drain electrode DE5.

The fifth gate electrode GE5 may be connected to the emission control line Ei. The fifth gate electrode GE5 may be disposed in a portion of the emission control line Ei or in a shape protruding from the emission control line Ei (e.g., in an extension portion of the emission control line Ei protruding from the main portion of the emission control line Ei). The fifth active pattern ACT5, the fifth source electrode SE5, and the fifth drain electrode DE5 may be formed of a semiconductor layer that is not doped with impurity or that is doped with impurity. For example, the fifth source electrode SE5 and the fifth drain electrode DE5 may be formed of a semiconductor layer doped with impurity, and the fifth active pattern ACT5 may be a semiconductor layer that is not doped with impurity. The fifth active pattern ACT5 corresponds to a portion overlapping the fifth gate electrode GE5.

One end of the fifth source electrode SE5 may be connected to the fifth active pattern ACT5. The other end of the fifth source electrode SE5 may be connected to the power supply line PL through the fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include the sixth gate electrode GE6, the sixth active pattern ACT6, the sixth source electrode SE6, and the sixth drain electrode DE6.

The sixth gate electrode GE6 may be connected to the emission control line Ei. The sixth gate electrode GE6 may be disposed in a portion of the emission control line Ei, or may be disposed in a shape protruding from the emission control line Ei (e.g., (e.g., in an extension portion of the emission control line Ei protruding from the main portion of the emission control line Ei). The sixth active pattern ACT6, the sixth source electrode SE6, and the sixth drain electrode DE6 may be formed of a semiconductor layer that is not doped with impurity or that is doped with impurity. For example, the sixth source electrode SE6 and the sixth drain electrode DE6 may be formed of a semiconductor layer doped with impurity, and the sixth active pattern ACT6 may be formed of a semiconductor layer that is not doped with impurity. The sixth active pattern ACT6 corresponds to a portion overlapping the sixth gate electrode GE6.

One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include the seventh gate electrode GE7, the seventh active pattern ACT7, the seventh source electrode SE7, and the seventh drain electrode DE7.

The seventh gate electrode GE7 may be connected to the i+1-th scan line Si+1. The seventh gate electrode GE7 may be disposed in a portion of the i+1-th scan line Si+1 or in a shape protruding from the i+1-th scan line Si+1 (e.g., in an extension portion of the i+1-th scan line Si+1 protruding from the main portion of the i+1-th scan line Si+1). The seventh active pattern ACT7, the seventh source electrode SE7, and the seventh drain electrode DE7 may be formed of a semiconductor layer that is not doped with impurity or that is doped with impurity. For example, the seventh source electrode SE7 and the seventh drain electrode DE7 may be formed of a semiconductor layer doped with impurity, and the seventh active pattern ACT7 may be formed of a semiconductor layer that is not doped with impurity. The seventh active pattern ACT7 corresponds to a portion overlapping the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power supply line IPL. In addition, the seventh drain electrode DE7 may be connected to the fourth source electrode SE4 of the fourth transistor T4 of the pixel PXL in the i+1-th row. The seventh drain electrode DE7 and the fourth source electrode SE4 of the fourth transistor T4 of the pixel PXL in the i+1-th row may be connected to each other through the auxiliary connection line AUX, the eighth contact hole CH8, and the ninth contact hole CH9.

The storage capacitor Cst may include a lower electrode LE and an upper electrode UE. The lower electrode LE may be formed of the first gate electrode GE1 of the first transistor T1.

The upper electrode UE may overlap the lower electrode LE and may cover the lower electrode LE when viewed in a plane view. A capacitance of the storage capacitor Cst may increase by enlarging an overlapping area between the upper electrode UE and the lower electrode LE. The upper electrode UE may extend in the first direction DR1. In an exemplary embodiment of the present invention, a voltage of the same level as a voltage of the first power source ELVDD may be supplied to the upper electrode UE. The upper electrode UE may have an opening OPN in a region in which the first contact hole CH1 through which the first gate electrode GE1 and the first connection line CNL1 are connected is formed.

The light emitting element OLED may include the first electrode AD, the second electrode CD, and an emission layer EML disposed between the first electrode AD and the second electrode CD.

In an exemplary embodiment of the present invention, one of the first electrode AD and the second electrode CD is an anode electrode and the other electrode is a cathode electrode. For example, the first electrode AD may be an anode electrode and the second electrode CD may be a cathode electrode. When the light emitting element OLED is a top emission type organic light emitting element, the first electrode AD may be a reflective electrode and the second electrode CD may be a transmissive electrode. In an exemplary embodiment of the present invention, the case in which the light emitting element OLED is a top emission type organic light emitting element and the first electrode AD is an anode electrode will be described as an example.

The first electrode AD may be disposed in an emission region corresponding to the pixel PXL. The first electrode AD may be connected to the seventh source electrode SE7 of the seventh transistor T7 and the sixth drain electrode DE6 of the sixth transistor T6 through the seventh contact hole CH7 and the tenth contact hole CH10 (e.g., the first electrode may be electrically connected to the pixel circuit). The second connection line CNL2 and a bridge pattern BRP may be disposed between the seventh contact hole CH7 and the tenth contact hole CH10 so that the sixth drain electrode DE6 and the seventh source electrode are connected to the first electrode AD.

Hereinafter, a structure of a display device according to an exemplary embodiment of the present invention will be described with reference to FIGS. 4 to 6.

A buffer layer BFL may be disposed on the substrate SUB.

The buffer layer BFL may prevent the impurity from diffusing into the first to seventh transistors T1 to T7. The buffer layer BFL may be provided as a single layer, or may be provided as multiple layers having at least two or more layers. When the buffer layer BFL is formed of multiple layers, each layer may be formed of the same material or may be formed of different materials. In exemplary embodiments, the buffer layer BFL may be omitted according to a material of the substrate SUB and a process condition.

The active patterns ACT1 to ACT7 (hereinafter referred to as ACT) may be disposed on the buffer layer BFL. The active pattern ACT may include the first active pattern ACT1 to the seventh active pattern ACT7. The first active pattern ACT1 to the seventh active pattern ACT7 may be formed of a semiconductor material.

A gate insulation layer GI may be disposed on the buffer layer BFL on which the active pattern ACT is disposed. The gate insulation layer GI may be, for example, an inorganic insulation layer including an inorganic material. For example, the gate insulation layer GI may include at least one of silicon nitride, silicon oxide, and silicon oxynitride.

The i−1-th scan line Si−1, the i-th scan line Si, the i+1 scan line Si+1, the emission control line Ei, and the first to seventh gate electrodes GE1 to GE7 may be disposed on the gate insulation layer GI. The first gate electrode GE may be the lower electrode LE of the storage capacitor Cst. The second gate electrode GE2 and the third gate electrode GE3 may be formed integrally with the i-th scan line Si. The fourth gate electrode GE4 may be formed integrally with the i−1-th scan line Si−1. The seventh gate electrode GE7 may be formed integrally with the i+1-th scan line Si+1. The fifth gate electrode GE5 and the sixth gate electrode GE6 may be formed integrally with the emission control line Ei.

The first insulation layer IL1 may be disposed on the scan lines Si−1, Si, S+1.

The upper electrode UE of the storage capacitor Cst and the initialization power supply line IPL may be disposed on the first insulation layer IL1. The upper electrode UE may cover the lower electrode LE. The upper electrode UE may form the storage capacitor Cst together with the lower electrode LE with the first insulation layer IL1 interposed therebetween.

The second insulation layer IL2 may be disposed on the substrate SUB on which the upper electrode UE and the initialization power supply line IPL are disposed.

The first and second connection lines CNL1 and CNL2, the auxiliary connection line AUX, the data line Dj, and the first power supply line PL1 may be disposed on the second insulation layer IL2.

The first connection line CNL1 may be connected to the first gate electrode GE1 through the first contact hole CH1, which passes through the first and second insulation layers IL1 and IL2. In addition, the first connection line CNL1 may be connected to the third drain electrode DE3 and the fourth drain electrode DE4 through the second contact hole CH2, which passes through the gate insulation layer GI, the first insulating layer IL1, and the second insulation layer IL2.

The second connection line CNL2 may be a pattern provided as a medium connecting the sixth drain electrode DE6 and the first electrode AD between the sixth drain electrode DE6 and the first electrode AD. The second connection line CNL2 may be connected to the sixth drain electrode DE6 and the seventh source electrode SE7 through the seventh contact hole CH7, which passes through the gate insulation layer GI, the first insulating layer IL1, and the second insulation layer IL2.

The auxiliary connection line AUX may be connected to the initialization power supply line IPL through the eighth contact hole CH8, which passes through the second insulation layer IL2. In addition, the auxiliary connection line AUX may be connected to the fourth source electrode SE4 and the seventh drain electrode DE7 of the pixel PXL in the i−1-th row through the ninth contact hole CH9, which passes through the gate insulation layer GI, the first insulating layer IL1, and the second insulation layer IL2.

The data line Dj may be connected to the second source electrode SE2 through the sixth contact hole CH6, which passes through the second insulation layer IL2, the first insulation layer IL1, and the gate insulation layer GI.

The first power supply line PL1 may be connected to the upper electrode UE of the storage capacitor Cst through the third contact hole CH3 and the fourth contact hole CH4, which pass through the second insulation layer IL2. The first power supply line PL1 may be connected to the fifth source electrode SE5 through the fifth contact hole CH5, which passes through the second insulation layer IL2, the first insulation layer IL1, and the gate insulation layer GI.

The third insulation layer IL3 may be disposed on the substrate SUB. The third insulation layer IL3 may be, for example, an inorganic insulation layer including an inorganic material, or an organic insulation layer including an organic material. In an exemplary embodiment of the present invention, the third insulation layer IL3 may be an organic insulation layer. The third insulation layer IL3 may be formed of a single layer as shown in FIGS. 5 and 6. However, the third insulating layer IL3 is not limited thereto. For example, in an exemplary embodiment, the third insulation layer IL3 may be formed of multiple layers. When the third insulation layer IL3 is formed of multiple layers, the third insulation layer IL3 may have a structure in which a plurality of inorganic insulation layers or a plurality of organic insulation layers are alternately stacked. For example, the third insulation layer IL3 may have a structure in which a first organic insulation layer, an inorganic insulation layer, and a second organic insulation layer are sequentially stacked.

The bridge pattern BRP may be disposed on the third insulation layer IL3.

The bridge pattern BRP may be connected to the second connection line CNL2 through the tenth contact hole CH10, which passes through the third insulation layer IL3.

The passivation layer PSV may be disposed on the bridge pattern BRP. The passivation layer PSV may include at least one of an inorganic insulation layer formed of an inorganic material and an organic insulation layer formed of an organic material. For example, the passivation layer PSV may include an inorganic insulation layer and an organic insulation layer disposed on the inorganic insulation layer. In an exemplary embodiment of the present invention, the passivation layer PSV may include an organic insulation layer.

The first electrode AD and the second power supply line PL2 may be disposed on the passivation layer PSV.

The first electrode AD may be connected to the bridge pattern BRP through an eleventh contact hole CH11, which passes through the passivation layer PSV. Since the bridge pattern BRP is connected to the second connection line CNL2 through the tenth contact hole CH10, the first electrode AD may be finally connected to the sixth drain electrode DE6 and the seventh source electrode SE7 through the bridge pattern BRP and the second connection line CNL2.

In an exemplary embodiment of the present invention, since the light emitting element OLED is a top emission type organic light emitting element, the first electrode AD may be a reflective electrode. Accordingly, the first electrode AD may include a reflective layer capable of reflecting light and a transparent conductive layer disposed on the upper or lower portion of the reflective layer. At least one of the transparent conductive layer and the reflective layer may be electrically connected to the sixth drain electrode DE6 and the seventh source electrode SE7.

The reflective layer may include a material capable of reflecting light. For example, the reflective layer may be formed of at least one of gold (Au), magnesium (Mg), aluminum (Al), silver (Ag), chromium (Cr), molybdenum (Mo), platinum (Pt), nickel (N1), palladium (Pd), calcium (Ca), neodymium (Nd), iridium (Ir), lithium (Li), and alloys thereof.

The transparent conductive layer may include a transparent conductive oxide. For example, the transparent conductive layer may include at least one of indium tin oxide (ITO), indium zinc oxide (IZO), aluminum zinc oxide (AZO), gallium-doped zinc oxide (GZO), zinc tin oxide (ZTO), gallium tin oxide (GTO), and fluorine-doped tin oxide (FTO).

The second power supply line PL2 may be disposed on the passivation layer PSV and be spaced apart from the first electrode AD. The second power supply line PL2 may be disposed on the same layer as the first electrode AD and include the same material as the first electrode AD. For example, the second power supply line PL2 may include the reflective layer and the transparent conductive layer.

A pixel definition layer PDL may be disposed on the substrate SUB on which the first electrode AD and the second power supply line PL2 are disposed. The pixel definition layer PDL includes an opening that exposes a portion of the first electrode AD to the outside. The pixel definition layer PDL may protrude from the substrate SUB along a periphery of the pixel PXL.

The pixel definition layer PDL may include an organic insulation layer. For example, the pixel definition layer PDL may be made of at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emission layer EML may be disposed on the exposed upper surface of the first electrode AD.

The emission layer EML may be disposed on the exposed surface of the first electrode AD. The emission layer EML may have a multiple thin layer structure including at least one light generation layer. For example, the emission layer EML may include a hole injection layer for injecting holes (which may have excellent transportability), a hole transport layer for increasing the chance of recombination of holes and electrons by blocking a movement of electrons which are not coupled in the light generating layer, the light generating layer which emits light by recombination of injected electrons and holes, a hole blocking layer for blocking the movement of holes which are not coupled in the light generating layer, an electron transport layer for smoothly transporting electrons to the light generating layer, and an electron injection layer for injecting electrons.

The color of light generated in the light generating layer may be one of, for example, red, green, blue, and white. However, the present invention is not limited thereto. For example, in exemplary embodiments, the color of light generated in the light generating layer of the emission layer EML may be one of magenta, cyan, and yellow.

Each of the hole injection layer, the hole transport layer, the hole blocking layer, the electron transport layer, and the electron injection layer may be a common layer connected to each other in adjacent emission regions.

The second electrode CD may be disposed on the emission layer EML. The second electrode CD may be electrically connected to the second power supply line PL2 through the twelfth contact hole CH12, which passes through the pixel definition layer PDL. Accordingly, the second power source ELVSS supplied to the second electrode CD may be transferred to the second power supply line PL2.

A thin film encapsulation film TFE covering the second electrode CD may be disposed on the second electrode CD.

The thin film encapsulation film TFE may be made of a single layer or may be made of multiple layers. The thin film encapsulation film TFE may include a plurality of insulation layers covering the light emitting element OLED. For example, the thin film encapsulation film TFE may include a plurality of inorganic layers and a plurality of organic layers. For example, the thin film encapsulation film TFE may have a structure in which the inorganic layer and the organic layer are alternately stacked. In addition, the thin film encapsulation film TFE may be an encapsulation substrate disposed on the light emitting element OLED and bonded to the substrate SUB, for example, by using a sealant.

In a display device according to an exemplary embodiment of the present invention, the substrate SUB includes an emission region EMA through which light is emitted from the emission layer EML, and a non-emission region NEMA excluding the emission region EMA through which light is not emitted from the emission layer EML.

Referring to FIGS. 6, 7A and 7B, in an exemplary embodiment, the passivation layer PSV includes at least one concave pattern CP disposed in a portion of the non-emission region NEMA. In addition, the passivation layer PSV includes a remaining portion in the non-emission region NEMA in which the concave pattern CP is not disposed. A flat portion FP is disposed in the remaining portion of the passivation layer PSV in which the concave pattern CP is not disposed. The flat portion FP extends from the remaining portion of the passivation layer PSV in the non-emission region NEMA to the emission region EMA, as shown in FIG. 6. The flat portion FP may be planarized by mitigating a step by the first to seventh transistors T1 to T7.

The passivation layer PSV is disposed between the pixel circuit (see FIG. 3) and the light emitting element OLED. The passivation layer PSV covers the pixel circuit and includes the concave pattern CP disposed in the non-emission region NEMA. The second power supply line PL2 is disposed on the passivation layer PSV in the non-emission region NEMA and is connected to the light emitting element OLED.

In an exemplary embodiment, the concave pattern CP is disposed on one side of the passivation layer PSV. For example, the concave pattern CP may be disposed on the upper surface of the passivation layer PSV in an area in which the first to seventh transistors T1 to T7 are not disposed, for example, in the non-emission region NEMA. In an exemplary embodiment, the concave pattern CP has a recessed shape in a direction from the upper surface of the passivation layer PSV toward the lower surface of the passivation layer PSV under which the first to seventh transistors T1 to T7 are disposed. For example, the concave pattern CP may have an upper surface disposed on the upper surface of the passivation layer PSV, and a lower surface that extends from the upper surface of the passivation layer PSV to an area below the upper surface of the passivation layer PSV, forming a concave structure. The concave pattern CP may have various shapes in addition to the shapes illustrated in FIGS. 6, 7A and 7B, and may have a specific width and size. However, the present invention is not limited thereto. In an exemplary embodiment of the present invention, the concave pattern CP may be provided in the same process as the eleventh contact hole CH11, which passes through the passivation layer PSV, to expose the bridge pattern BRP.

The passivation layer PSV including the concave pattern CP and the flat portion FP may have a structure in which a portion of a surface thereof is curved.

Since the second power supply line PL2 is disposed on the passivation layer PSV in the non-emission region NEMA, and since the second power supply line PL2 may be very thin, the shape of the second power supply line PL2 may be affected by the passivation layer PSV disposed thereunder.

Therefore, the second power supply line PL2 may have a shape corresponding to the curved structure of the passivation layer PSV.

In an exemplary embodiment of the present invention, the second power supply line PL2 includes the uneven pattern RP, which is disposed in the non-emission region NEMA and corresponds to the concave pattern CP of the passivation layer PSV. For example, the uneven pattern RP has a shape corresponding to the concave pattern CP. For example, in an exemplary embodiment, the uneven pattern RP and the concave pattern CP have the same shape, and the uneven pattern RP is conformally disposed on the concave pattern CP with no space disposed between the uneven pattern RP and the concave pattern CP.

As shown in FIG. 7A, in an exemplary embodiment, the concave pattern CP has a semi-elliptic shape that is depressed from the upper surface of the passivation layer PSV toward the lower surface of the passivation layer PSV. In this case, the uneven pattern RP has a shape corresponding to the semi-elliptic shape. The concave pattern CP is recessed from the upper surface of the passivation layer PSV toward the lower surface of the passivation layer PSV to have a width W between about 1.2 µm and about 2 µm and a depth d between about 0.3 µm and about 0.5 µm. According to an exemplary embodiment of the present invention, as shown in FIG. 7B, the concave pattern CP may have a quadrangular shape that is recessed from the upper surface of the passivation layer PSV toward the lower surface of the passivation layer PSV. In this case, the uneven pattern RP has a shape corresponding to the quadrangular shape.

As described above, according to exemplary embodiments of the present invention, the concave pattern CP and the uneven pattern RP may have a semi-elliptical or a quadrangular shape. However, the present invention is not limited thereto. For example, according to exemplary embodiments, the concave pattern CP and the uneven pattern RP may have various shapes including a circular shape, a polygonal shape, a trapezoidal shape, etc.

In an exemplary embodiment, a metal line may be disposed under the uneven pattern RP of the second power supply line PL2 with the passivation layer PSV interposed therebetween. In this case, the passivation layer PSV may be designed to have a sufficient thickness so that a parasitic capacitance is not generated between the second power supply line PL2 and the metal line. For example, the passivation layer PSV may have a thickness of about 0.35 µm or more.

In an exemplary embodiment of the present invention, the second power supply line PL2 may have an uneven and curved shape, for example, a rugged shape, due to the uneven pattern RP. In this case, light introduced to the display device from the environment in which the display device is located (e.g., light introduced to the display device from outside of the display device), which is hereinafter referred to as "an external light", may be irregularly reflected by the uneven pattern RP of the second power supply line PL2 in the non-emission region NEMA.

The uneven pattern RP may result in the second power supply line PL2 having a structure that causes irregular reflection of the external light. For example, the uneven pattern RP may be formed in various shapes that may cause an irregular reflection of the external light. As described above, the uneven pattern RP may correspond to the shape of the concave pattern CP of the passivation layer PSV. Therefore, by designing the concave pattern CP to cause the irregular reflection of the external light, the uneven pattern RP may have a shape corresponding to the concave pattern CP.

The irregular reflection of the external light generated in the non-emission region NEMA may be canceled by destructive interference with the reflection of the external light generated in the emission region EMA. Therefore, the display device according to an exemplary embodiment of the present invention may improve a black display capability by reducing a reflectance of the external light and increasing a contrast ratio, thereby improving display quality.

For example, the external light incident on the emission region EMA may be reflected by the elements disposed in the emission region EMA (e.g., the light emitting elements OLED, the first to seventh transistors T1 to T7, etc.). The external light reflected from the emission region EMA may be reflected not only in the emission region EMA, but also to various directions by causing an irregular reflection or a mirror reflection (e.g., a reflection with the same reflection angle). At the same time, the external light incident on the non-emission region NEMA may be irregularly reflected by the second power supply line PL2 including the uneven pattern RP. For convenience of explanation, the external light reflected from the emission region EMA is referred to herein as the first external light, and the external light irregularly reflected from the non-emission region NEMA is referred to as the second external light.

The first external light reflected from the emission region EMA to the non-emission region NEMA may be canceled by destructive interference with the second external light. Therefore, a display device in which the reflectance of the external light may be reduced may be implemented according to exemplary embodiments of the present invention.

The reflectance of the external light incident on the display device of an exemplary embodiment of the present invention in which the uneven pattern RP is disposed on the upper surface of the second power supply line PL2, and the reflectance of the external light incident on a display device of a comparative example in which the uneven pattern RP is not disposed thereon, is exemplified in Table 1 below and FIGS. 8A and 8B.

TABLE 1

|  | Comparative Example (see FIGs. 8A and 9A) | Exemplary Embodiment of Present Invention (see FIGs. 8B and 9B) |
|---|---|---|
| Measuring Region | 1 Cell (5 Point) | 1 Cell (5 Point) |
| Reflectance (SCI/SCE) | 5.20/0.45 | 4.94/0.78 |

Table 1 shows a numerical value obtained by measuring the display device of the comparative example and the display device according to an exemplary embodiment of the present invention with a device for measuring a reflectance (see FIGS. 8A and 8B). The region measured by the device for measuring the reflectance may be one cell of the comparative example composed of five pixels, and one cell of the exemplary embodiment of the present invention composed of five pixels. SCI (Specular Component Included) in Table 1 refers to a value obtained by adding a mirror reflectance and a diffuse reflectance, and SCE (Specular Component Excluded) in Table 1 refers to the diffuse reflectance. Herein, the mirror reflectance refers to a reflectance within a viewing angle of about 8°, and the diffuse reflectance refers to a reflectance larger than a viewing angle of about 8°.

As shown in Table 1 and FIGS. 8A and 8B, the SCI of the display device according to an exemplary embodiment having the uneven pattern RP decreases compared to the SCI of the comparative example. The reflectance of the external light incident on the display device decreases as the SCI decreases.

The measuring result of the chrominance according to a phase angle at the front in each of the comparative example and exemplary embodiment is shown in FIGS. 9A and 9B. In FIG. 9A, 0.5 mm in the comparative example represents the chrominance at a point separated by 0.5 mm from one cell (hereinafter, referred to as "a first reference cell") in the comparative example, and 1 mm in the comparative example represents the chrominance at a point separated by 1 mm from the first reference cell. In FIG. 9B, 0.5 mm in the exemplary embodiment represents the chrominance at a point separated by 0.5 mm from one cell (hereinafter, referred to as "a second reference cell") in the exemplary embodiment, and 1 mm in the exemplary embodiment represents the chrominance at a point separated by 1 mm from the second reference cell.

As shown in FIGS. 9A and 9B, the chrominance according to the phase angle at the front in the exemplary embodiment having the uneven pattern RP becomes closer to a center (0, 0) compared to that of the comparative example. The chrominance according to the phase angle at the front becoming closer to the center (0, 0) represents a real black. A real black refers to a more accurately displayed black color. As described above, exemplary embodiments of the present invention having the uneven pattern RP produces an improved real black compared to the comparative example, thereby improving a contrast ratio of the display device.

As described above, a display device according to an exemplary embodiment of the present invention may produce the real black by reducing the reflectance of external light by disposing the uneven pattern RP on the second power supply line PL2 in the non-emission region NEMA. Therefore, the display device according to an exemplary embodiment of the present invention may provide an improved quality screen.

FIGS. 10A to 10H are cross-sectional views sequentially showing a manufacturing method of the display device of FIG. 4 according to an exemplary embodiment of the present invention.

Figure 10A:
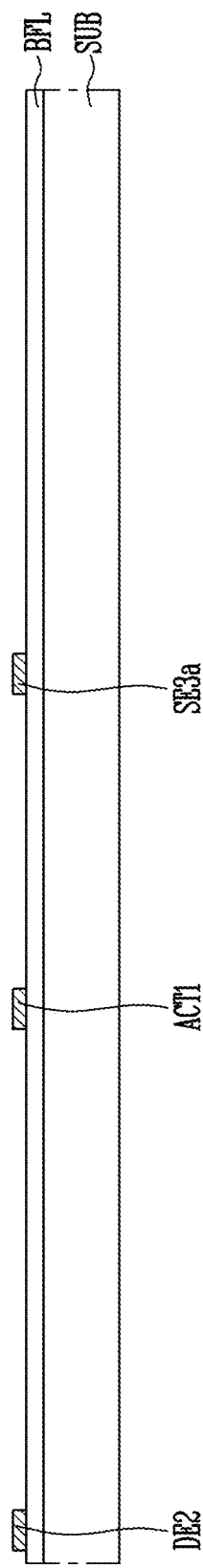

First, referring to FIGS. 4 and 10A, a buffer layer BFL is formed on the substrate SUB. Next, the first to seventh active patterns ACT1 to ACT7, the first to seventh source electrodes SE1 to SE7, and the first to seventh drain electrodes DE1 to DE7 are formed on the buffer layer BFL. In exemplary embodiments, the buffer layer BFL may be omitted according to a material of the substrate SUB and a process condition.

Figure 10B:
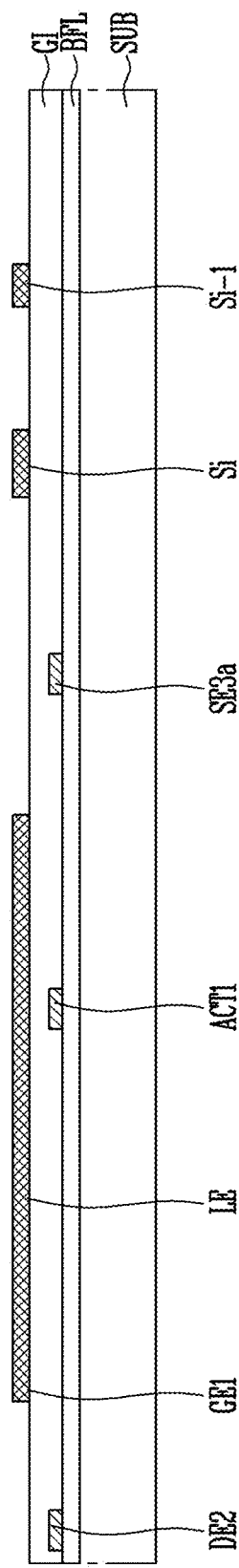

Referring to FIGS. 4 and 10B, a gate insulation layer GI is formed on the substrate SUB on which the first to seventh active patterns ACT1 to ACT7 and the like are formed. The first to seventh gate electrodes GE1 to GE7, the scan lines Si−1, Si and Si+1, the emission control line Ei, and the lower electrode LE are formed on the gate insulation layer GI.

Figure 10C:
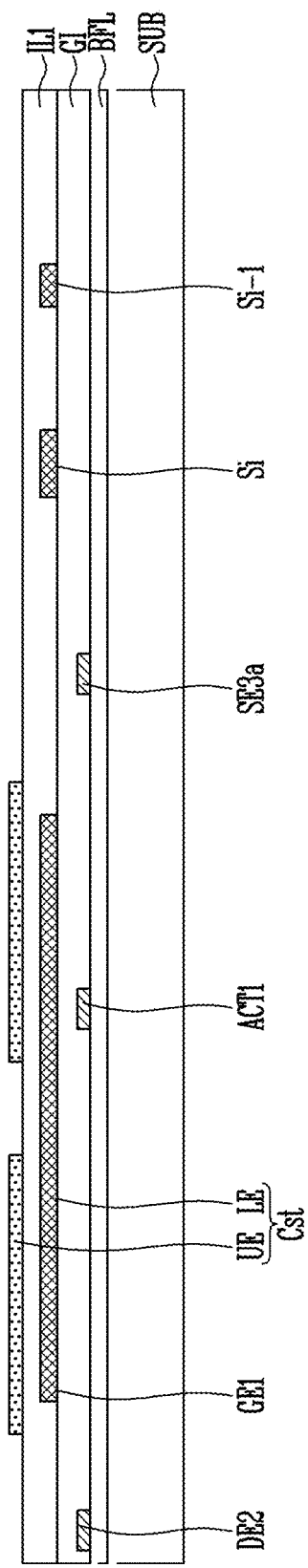

Referring to FIGS. 4 and 10C, the first insulation layer IL1 is formed on the substrate SUB on which the first to seventh gate electrodes GE1 to GE7 and the like are formed.

The upper electrode UE and then initialization power supply line IPL are formed on the first insulation layer IL1. The upper electrode UE may form a storage capacitor Cst together with the lower electrode LE.

Referring to FIGS. 4 and 10D, the second insulation layer IL2 is formed on the substrate SUB on which the upper electrode UE and the initialization power supply line IPL are formed. At this time, the second insulation layer IL2 and the first insulation layer IL disposed under the second insulation layer IL2 may be patterned to include the first contact hole CH1 for exposing the first gate electrode GE1 to the outside.

The data line Dj, the first power supply line PL1, the first and second connection lines CNL1 and CNL2, and the auxiliary connection line AUX are formed on the second insulation layer IL2.

Referring to FIGS. 4 and 10E, the third insulation layer IL3 is formed on the substrate SUB on which the data line Dj and the like is formed. Next, a bridge pattern BRP is formed on the substrate SUB on which the third insulation layer IL3 is formed.

Next, a passivation layer PSV is formed on the substrate SUB on which the bridge pattern BRP is formed. The passivation layer PSV may include the eleventh contact hole CH11, the flat portion FP, and the concave pattern CP. The step of forming the passivation layer PSV according to an exemplary embodiment is described as follows.

An organic insulation layer is coated on the substrate SUB on which the bridge pattern BRP is formed. Herein, the organic insulation layer may include, for example, polyimide, polyacryl, benzocyclobotene resin, etc. Next, a mask process using the photosensitive material is performed to form the eleventh contact hole CH11 and the concave pattern CP exposing a portion of the bridge pattern BRP. At this time, the eleventh contact hole CH11 and the concave pattern CP may be formed at the same time by adjusting the amount of light irradiated during an exposure of the mask process and a developer in a developing process. The passivation layer PSV including the concave pattern CP may have a curved shape such that a portion of a surface thereof is rugged. In addition, by using a halftone mask in the mask process, the eleventh contact hole CH11 and the concave pattern CP may be simultaneously formed. For example, in an exemplary embodiment, the passivation layer PSV is formed by coating an insulating material layer on the pixel circuit, and exposing and developing a portion of the insulating material layer to form a through hole and the concave pattern CP simultaneously.

Figure 10F:
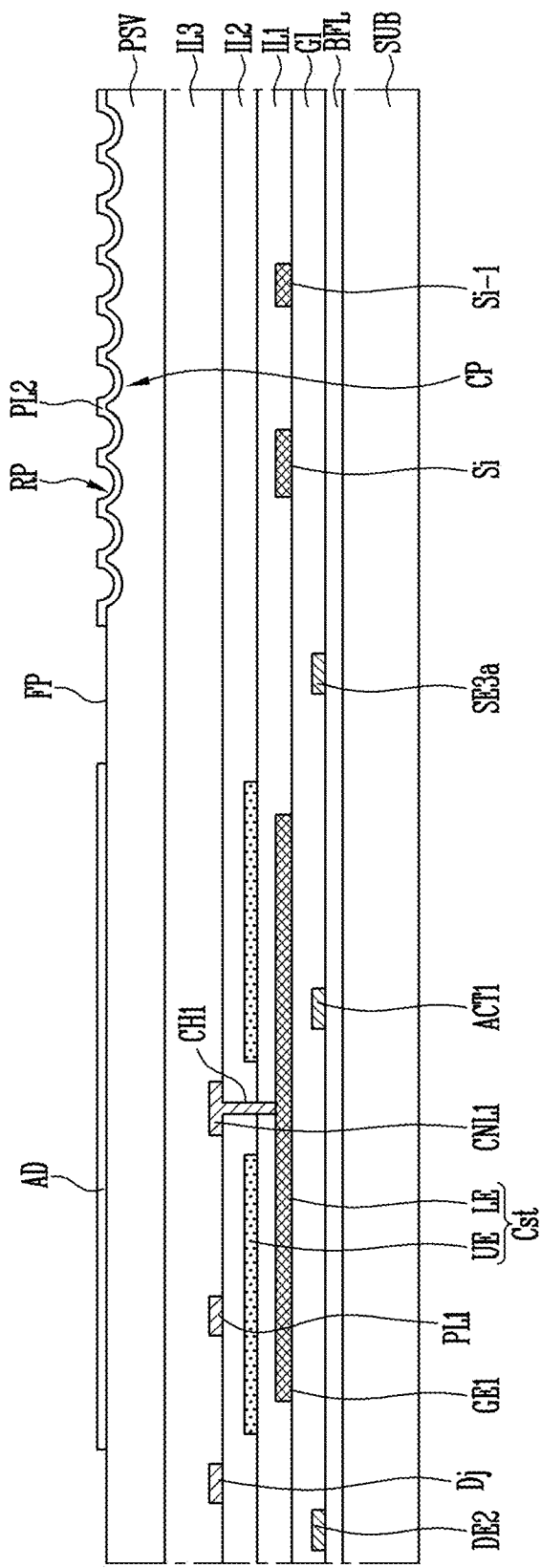

Referring to FIGS. 4 and 10F, the first electrode AD and the second power supply line PL2 are formed on the substrate SUB on which the passivation layer PSV is formed.

The second power supply line PL2 is spaced apart from the first electrode AD on the passivation layer PSV and has a shape corresponding to the surface of the passivation layer PSV. Since the second power supply line PL2 may be very thin, the second power supply line PL2 has a shape corresponding to a curved shape of the passivation layer PSV disposed under the second power supply line PL2. Therefore, the second power supply line PL2 includes the uneven pattern RP corresponding to the concave pattern CP of the passivation layer PSV.

Figure 10G:
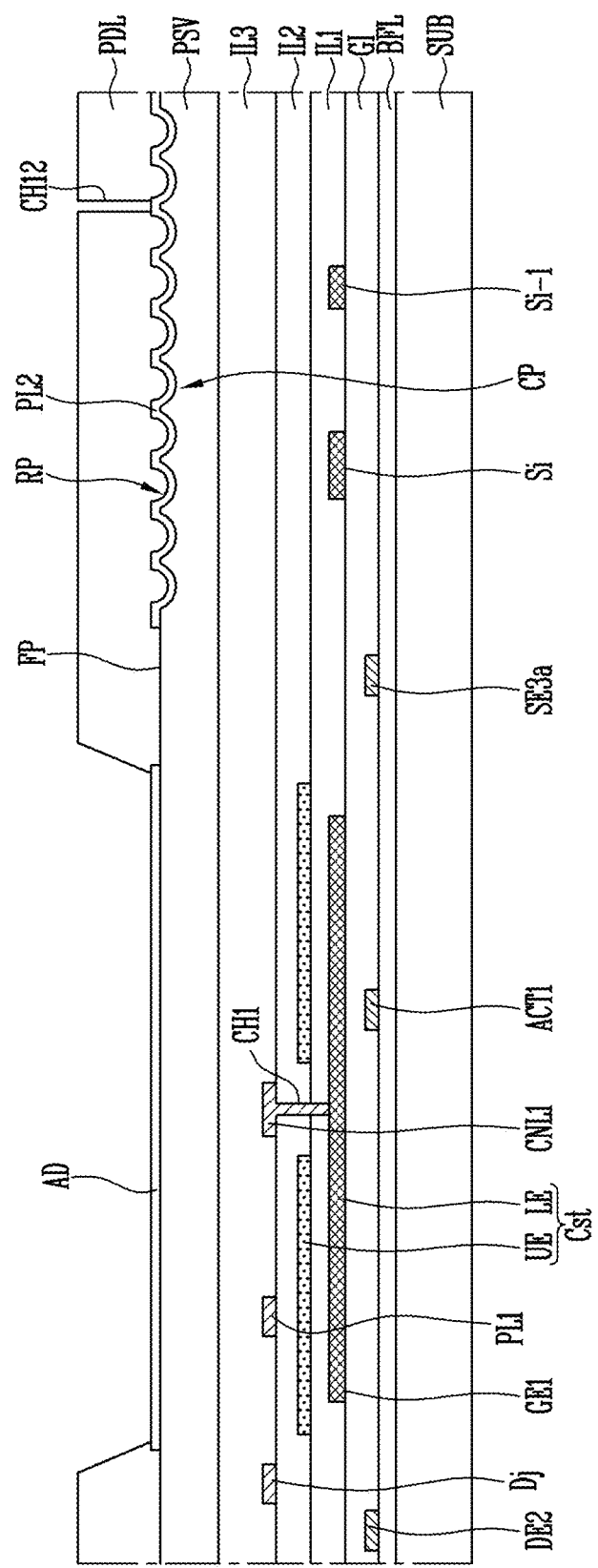

Referring to FIGS. 4 and 10G, a pixel definition layer PDL is formed on the substrate SUB on which the first electrode AD and the second power supply line PL2 are formed. The pixel definition layer PDL includes an opening for exposing a portion of the surface of the first electrode AD to the outside, and the twelfth contact hole CH12 for exposing a portion of the second power supply line PL2 to the outside.

Figure 10H:
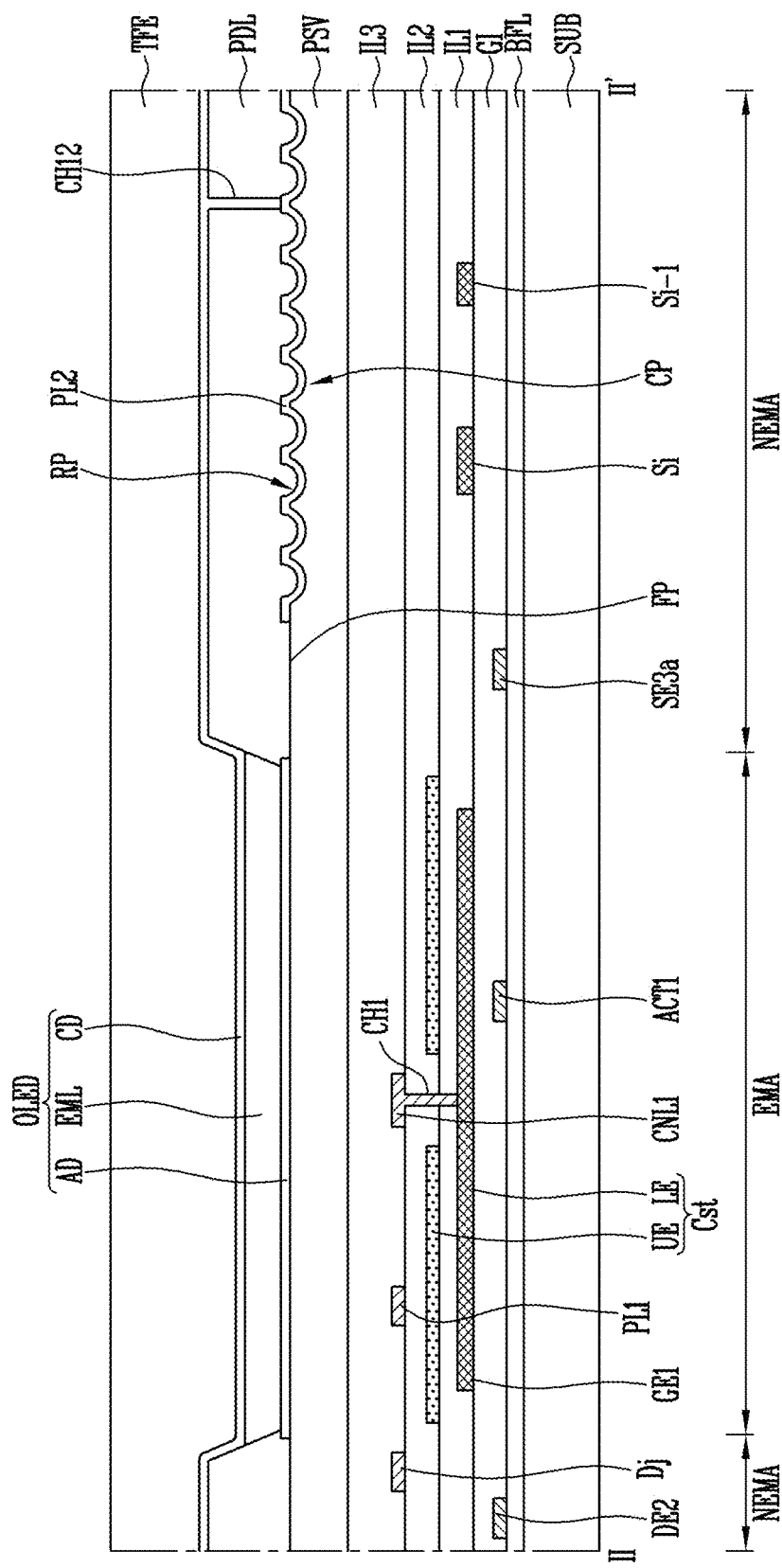

Referring to FIGS. 4 and 10H, the emission layer EML is formed on the first electrode AD exposed to the outside by the opening of the pixel definition layer PDL. Subsequently, the second electrode CD is formed on the substrate SUB on which the emission layer EML is formed. The first electrode AD, the emission layer EML, and the second electrode CD form a light emitting element OLED. The substrate SUB includes an emission region EMA corresponding to the area in which light is emitted by the light emitting element OLED, and a non-emission region NEMA excluding the emission region EMA in which light is not emitted by the light emitting element OLED. The second power supply line PL2 including the uneven pattern RP is disposed in the non-emission region NEMA, and the first electrode AD is disposed in the emission region EMA.

Next, the thin film encapsulation film TFE is formed on the substrate SUB on which the second electrode CD is formed. The thin film encapsulation film TFE may prevent oxygen and moisture from penetrating into the light emitting element OLED. The thin film encapsulation film TFE may include a plurality of inorganic layers and a plurality of organic layers.

Figure 11:
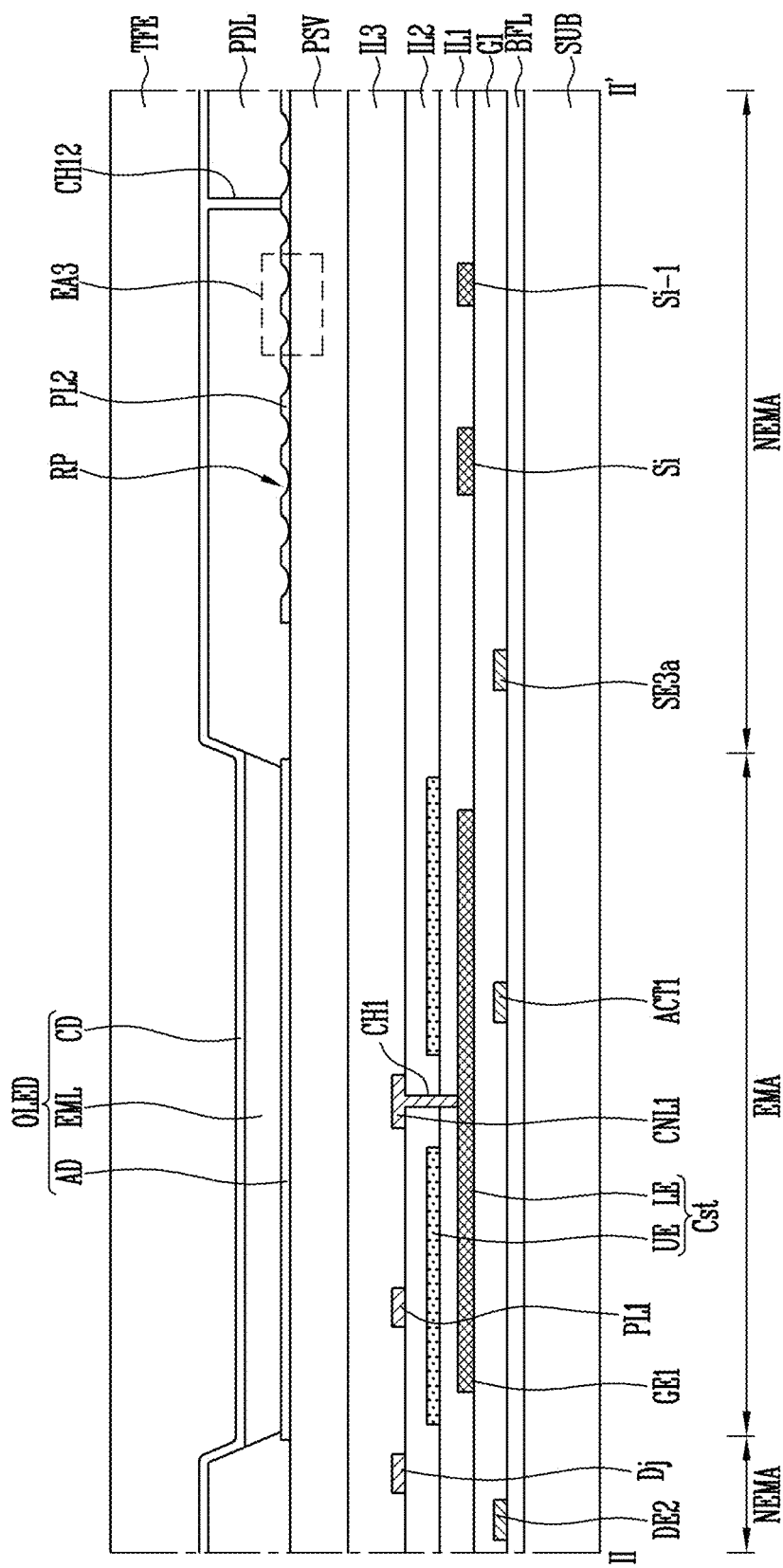
FIG. 11 is a cross-sectional view taken along line II-II' of FIG. 4 according to an exemplary embodiment of the present invention.
Figure 12A:
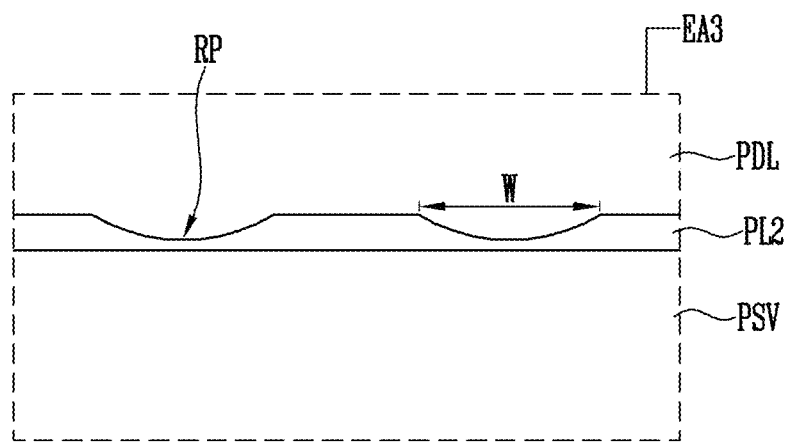
FIG. 12A is an enlarged view of region EA3 in FIG. 11 according to an exemplary embodiment of the present invention.
Figure 12B:
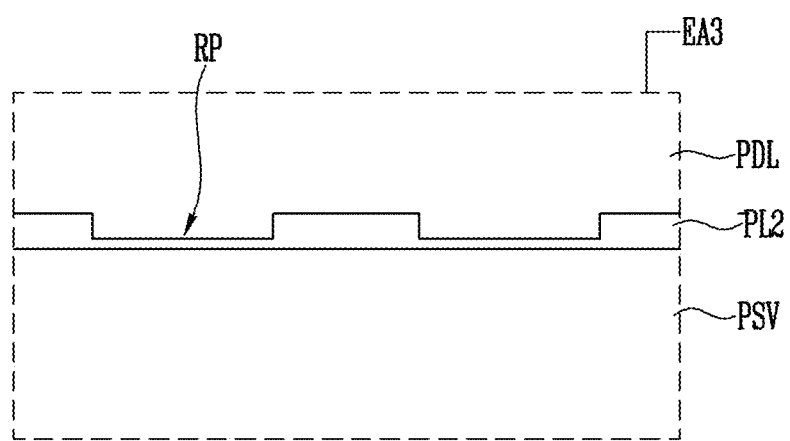
FIG. 12B is an enlarged view of region EA3 in FIG. 11 according to an exemplary embodiment of the present invention.

FIG. 11 is a cross-sectional view taken along line II-II' of FIG. 4 according to an exemplary embodiment of the present invention. FIG. 12A is an enlarged view of region EA3 in FIG. 11 according to an exemplary embodiment of the present invention. FIG. 12B is an enlarged view of region EA3 in FIG. 11 according to an exemplary embodiment of the present invention. For convenience of explanation, a further description of elements previously described may be omitted herein, and differences from the exemplary embodiments previously described will be primarily described herein. Herein, the same numerals denote the same elements, and similar numerals denote similar elements.

Referring to FIGS. 4, 11, 12A and 12B, a display device according to an exemplary embodiment of the present invention includes a substrate SUB, first to seventh transistors T1 to T7 disposed on the substrate SUB, a light emitting element OLED, and a thin film encapsulation film TFE disposed on the light emitting element OLED.

The light emitting element OLED includes the first electrode AD connected to the first to seventh transistors T1 to T7, an emission layer EML disposed on the first electrode AD, and the second electrode CD disposed on the emission layer EML.

The substrate SUB includes an emission region EMA and a non-emission region NEMA excluding the emission region EMA. The emission region EMA is a region in which light is emitted by the light emitting element OLED, and the non-emission region NEMA is a region in which the light is not emitted by the light emitting element OLED.

The display device further includes a passivation layer PSV and a second power supply line PL2. The passivation layer PSV may be disposed between the first to seventh transistors T1 to T7 and the light emitting element OLED, and the second power supply line PL2 may be spaced apart from the first electrode AD by a predetermined distance on the passivation layer PSV.

The passivation layer PSV may be disposed on the first to seventh transistors T1 to T7 disposed under the passivation layer PSV to protect the first to seventh transistors T1 to T7. In addition, the passivation layer PSV may be planarized by mitigating a step due to the first to seventh transistors T1 to T7. In an exemplary embodiment of the present invention, the passivation layer PSV may have a flat surface.

The second power supply line PL2 is disposed on the passivation layer PSV of the non-emission region NEMA. The second power supply line PL2 is electrically connected to the second electrode CD through the twelfth contact hole CH12, which passes through the pixel definition layer PDL. Therefore, the second power source (see ELVSS in FIG. 3) supplied to the second electrode CD is transferred to the second power supply line PL2. The second power supply line PL2 is disposed on the same layer as the first electrode AD and includes the same material as the first electrode AD.

In an exemplary embodiment of the present invention, the second power supply line PL2 includes the uneven pattern RP. The uneven pattern RP is disposed on one surface of the second power supply line PL2. For example, the uneven pattern RP may be disposed on the upper surface of the second power supply line PL2. The uneven pattern RP has a recessed shape from the upper surface of the second power supply line PL2 toward the lower surface of the second power supply line PL2 under which the passivation layer PSV is disposed. The uneven pattern RP may be formed, for example, by forming the second power supply line PL2 and then performing an etching process.

As shown in FIG. 12A, in an exemplary embodiment, the uneven pattern RP has a recessed semi-elliptical shape from the upper surface of the second power supply line PL2 toward the lower surface of the second power supply line PL2. The uneven pattern RP may have a width W between about 1.2 μm and about 2 μm. As shown in FIG. 12B, in an exemplary embodiment, the uneven pattern RP has a quadrangular shape that is depressed from the upper surface of the second power supply line PL2 toward the lower surface of the second power supply line PL2. As described above, the uneven pattern RP may have a semi-elliptical shape or a quadrangular shape. However, the shape of the uneven pattern RP is not limited thereto and may be modified into various shapes that cause an irregular reflection of light incident on the display device from the outside.

As shown in FIGS. 7A and 7B, according to exemplary embodiments of the present invention, the second power supply line PL2 includes an uneven pattern RP, and the passivation layer PSV includes a concave pattern CP. As shown in FIGS. 12A and 12B, according to exemplary embodiments of the present invention, the second power supply line PL2 includes an uneven pattern RP, and the passivation layer PSV is substantially flat (e.g., exactly flat, or almost exactly flat within a measurement error as would be understood by a person having ordinary skill in the art) and does not include a concave pattern.

Figure 13:
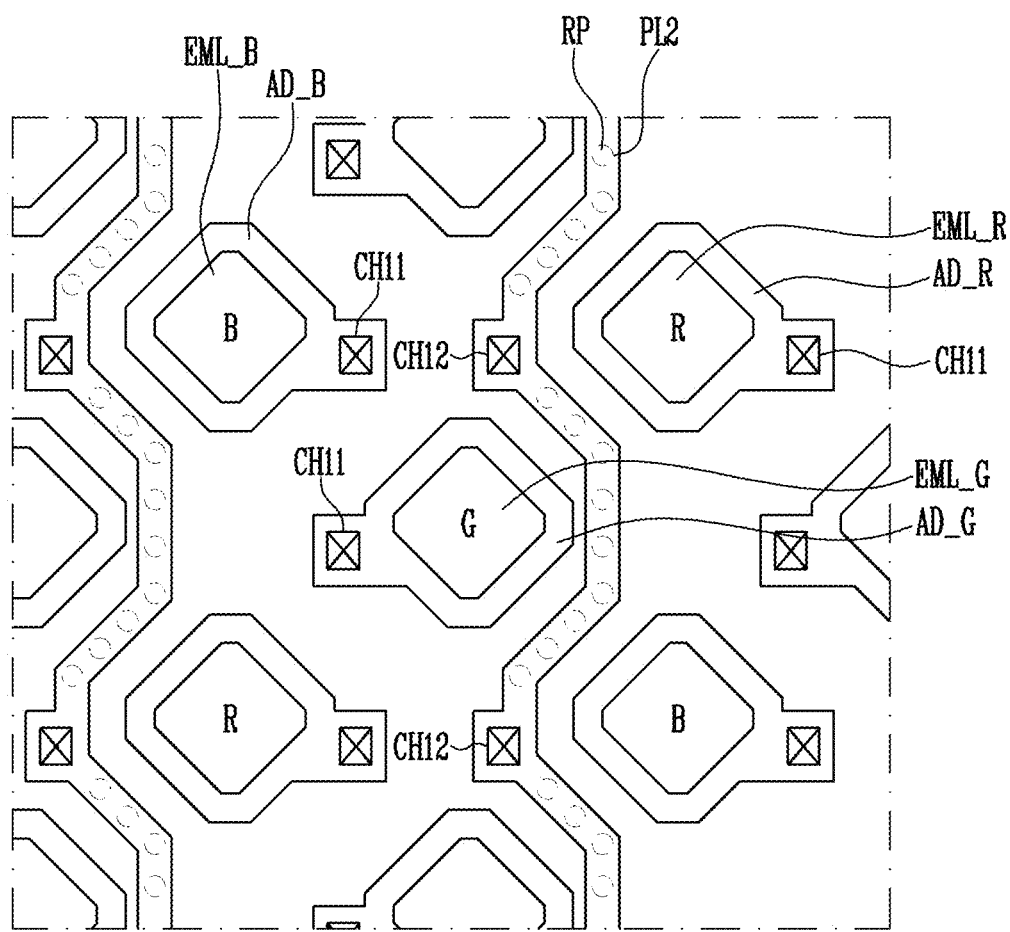
FIG. 13 is a plan view schematically showing an arrangement relationship between a pixel and a second power supply line in the display device shown in FIG. 4 according to an exemplary embodiment of the present invention.

FIG. 13 is a plan view schematically showing an arrangement relationship between a pixel and a second power supply line in the display device shown in FIG. 4 according to an exemplary embodiment of the present invention. In FIG. 13, for convenience of illustration, lines connected to the plurality of pixels are omitted.

Referring to FIGS. 4 and 13, a display device according to an exemplary embodiment of the present invention includes a substrate SUB on which the first pixel R, the second pixel G, and the third pixel B are disposed. In an exemplary embodiment of the present invention, the first pixel R is a pixel for emitting red light, the second pixel G is a pixel for emitting green light, and the third pixel B is a pixel for emitting blue light. However, the pixels are not limited thereto.

The first pixel R may include the first electrode for the first pixel AD_R, an emission layer for the first pixel EML_R for emitting red light, and the second electrode (see CD in FIG. 6) disposed on the emission layer for the first pixel EML_R. The first electrode for a first pixel AD_R may be connected to the first transistor T1 disposed in the first pixel R through the eleventh contact hole CH11.

The second pixel G may include the first electrode for the second pixel AD_G, an emission layer for the second pixel EML_G for emitting green light, and the second electrode (see CD in FIG. 6) disposed on the emission layer for the second pixel EML_G. The first electrode for the second pixel AD_G may be connected to the first transistor T1 disposed in the second pixel G through the eleventh contact hole CH11.

The third pixel B may include the first electrode for the third pixel AD_B, an emission layer for the third pixel EML_B for emitting blue light, and the second electrode (see CD in FIG. 6) disposed on the emission layer for the third pixel EML_B. The first electrode for the third pixel AD_B may be connected to the first transistor T1 disposed in the third pixel B through the eleventh contact hole CH11.

The second electrodes CD included in the first to third pixels R, G, and B may be disposed over an entire surface of the substrate SUB as a common layer.

The second power supply line PL2 is disposed on the substrate SUB and is spaced apart from the first to third pixels R, G, and B. For example, in an exemplary embodiment, the second power supply line PL2 is disposed on the substrate SUB and is spaced apart from the first electrode for the first pixel AD_R, the first electrode for the second pixel AD_G, and the first electrode for the third pixel AD_B.

The second power supply line PL2 extends lengthwise in one direction (e.g., a column direction) of the substrate SUB, and may have a plurality of bent shapes in the extended longitudinal direction in a plane view, as shown in FIG. 13. The second power supply line PL2 may be electrically connected to the second electrode CD through the twelfth contact hole CH12, which passes through a pixel definition layer (see PDL in FIG. 6). As a result, the second power source (see ELVSS in FIG. 3) supplied to the second electrode CD may be transmitted to the second power supply line PL2.

In an exemplary embodiment of the present invention, the second power supply line PL2 includes at least one uneven pattern RP disposed in the extended longitudinal direction. The uneven pattern RP may be regularly disposed on the surface of the second power supply line PL2 so that distances between the uneven pattern RP and the uneven pattern RP adjacent thereto are constant. However, the invention is not limited thereto. For example, in an exemplary embodiment, the uneven pattern PR is irregularly disposed on the surface of the second power supply line PL2 so that distances between the uneven pattern RP and the uneven pattern RP adjacent thereto are different from each other.

According to exemplary embodiments of the present invention, the uneven pattern RP is designed to have a shape that causes irregular reflection of light incident on the display device from the outside. When viewed in a plane, the uneven pattern RP may have a dot shape. However, the uneven pattern RP is not limited thereto. For example, the uneven pattern PR may be modified into various shapes such as a semi-elliptical shape, a quadrangle shape, a trapezoidal shape, a polygonal shape, etc.

Figure 14:
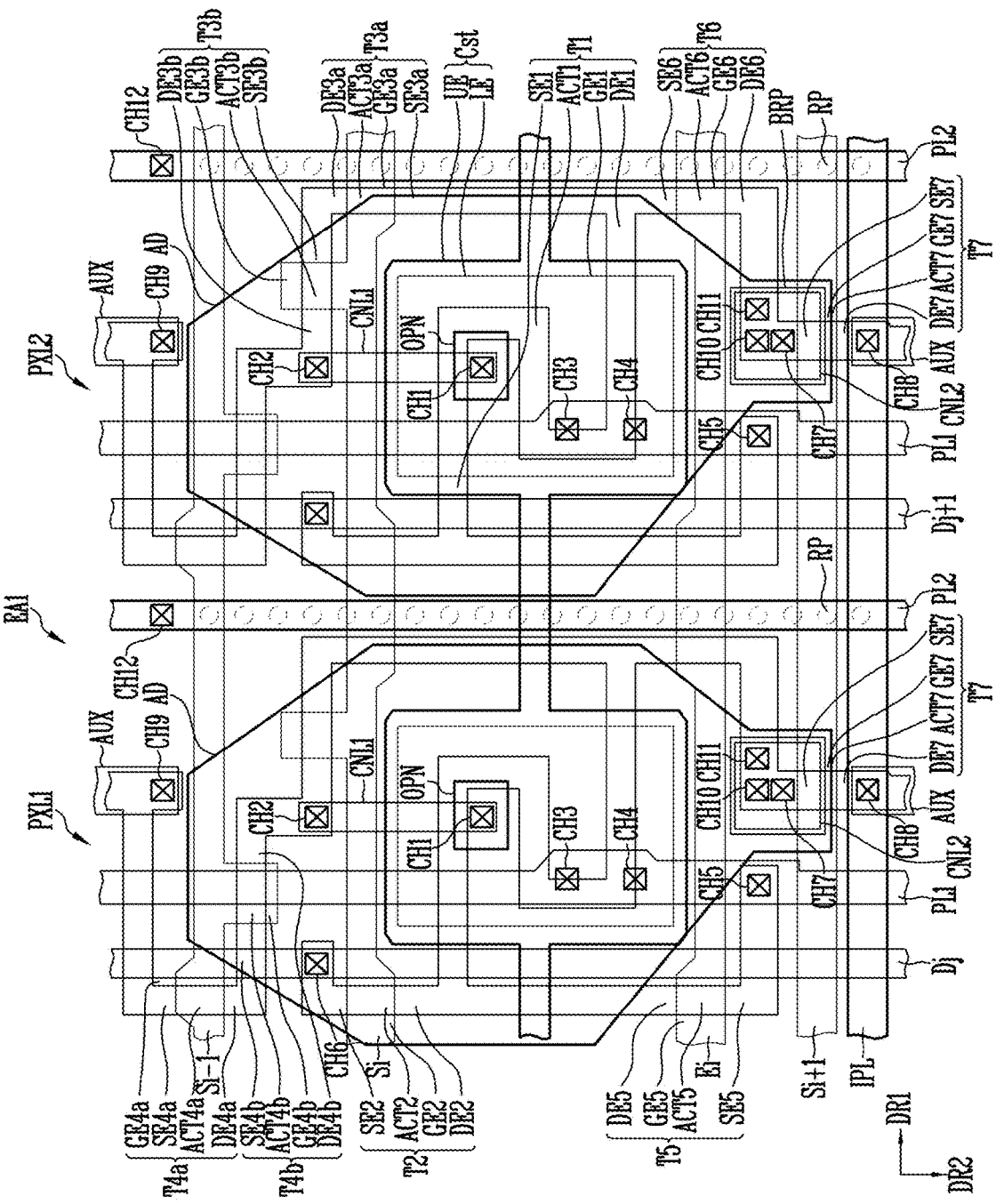
FIG. 14 is an enlarged view of region EA1 in FIG. 1 according to an exemplary embodiment of the present invention.
Figure 15A:
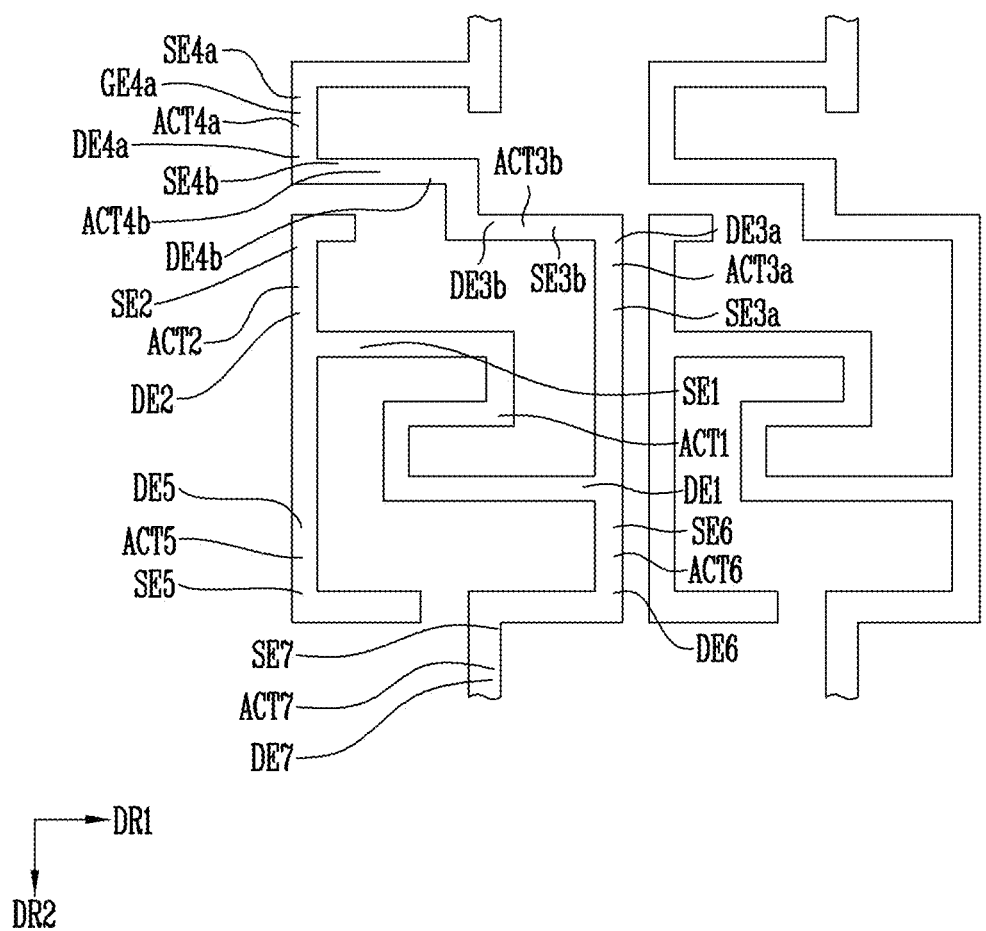
FIGS. 15A to 15F are layout views schematically showing an element of a pixel shown in FIG. 14 by layer according to an exemplary embodiment of the present invention.
Figure 15B:
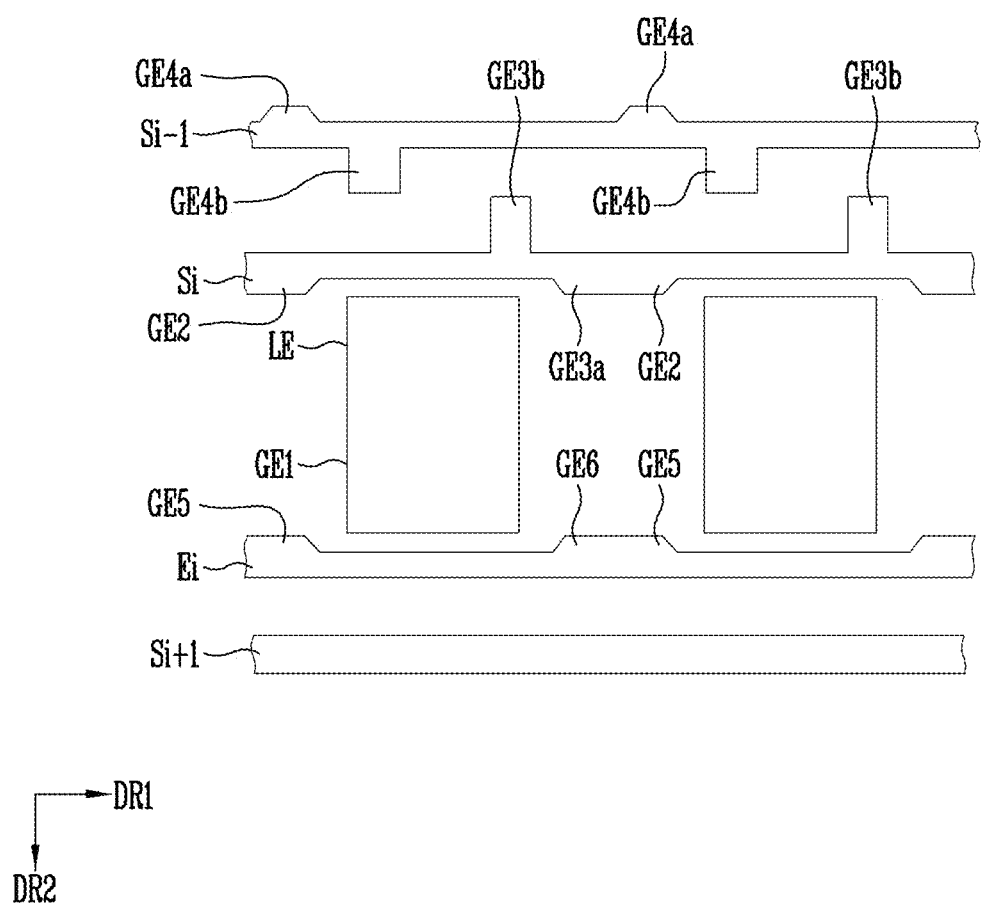
Figure 15C:
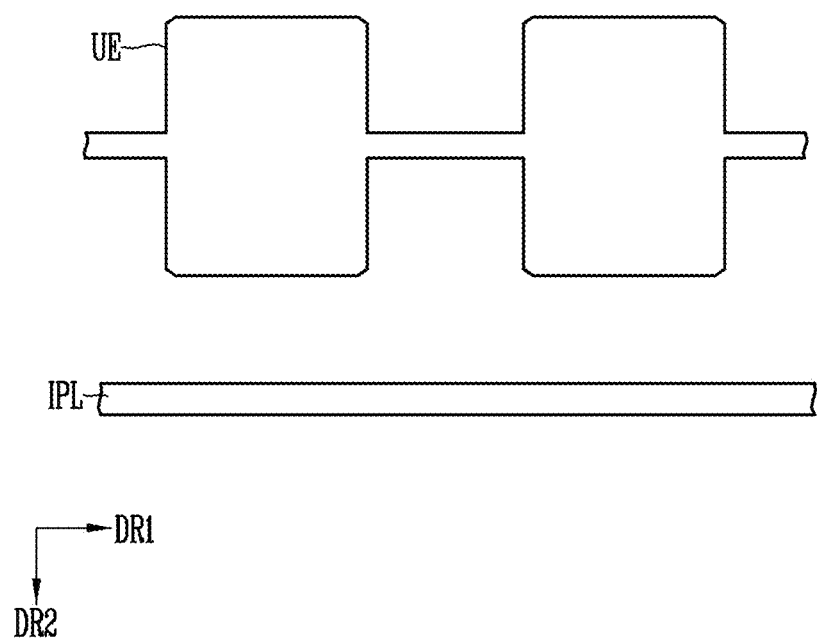
Figure 15D:
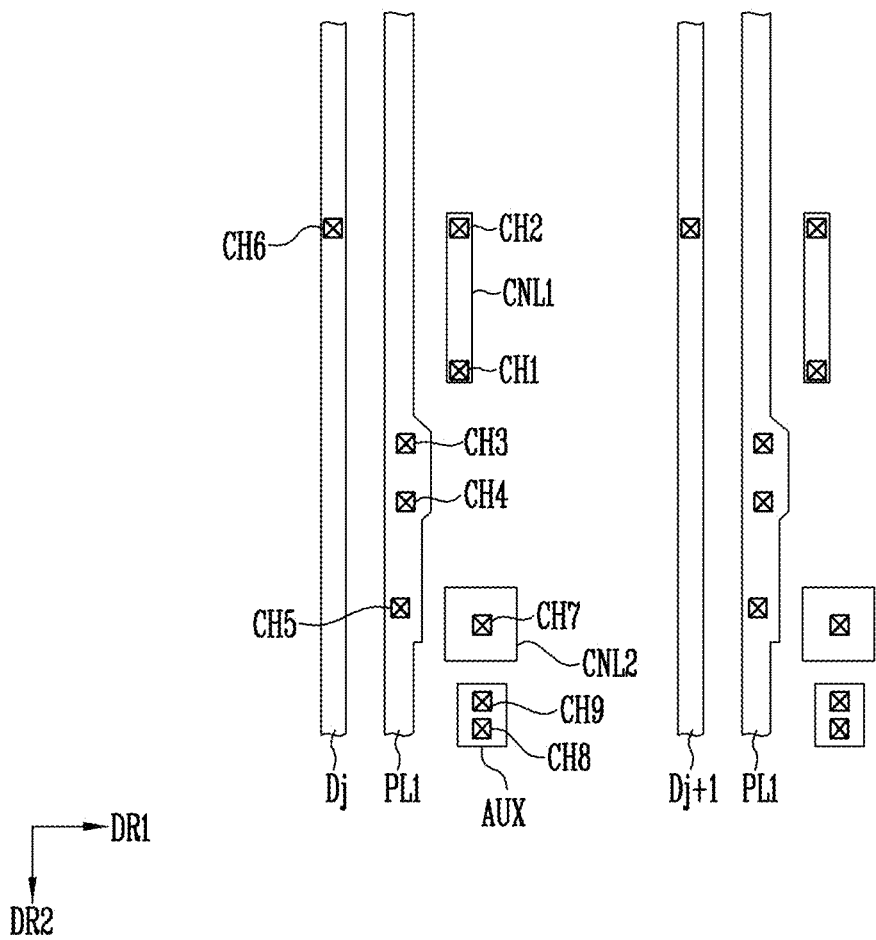
Figure 15E:
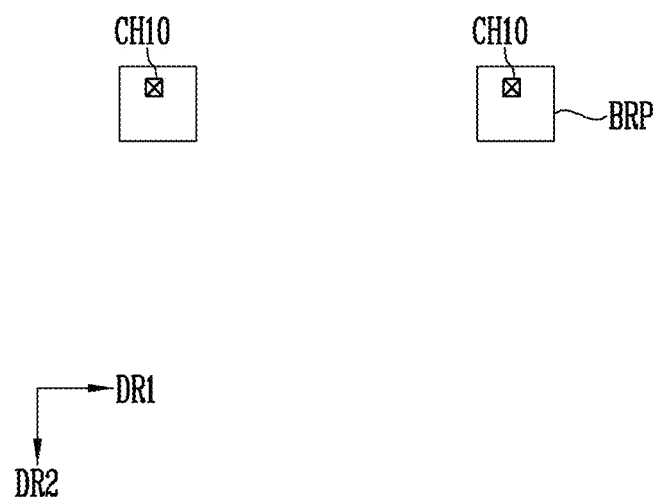
Figure 15F:
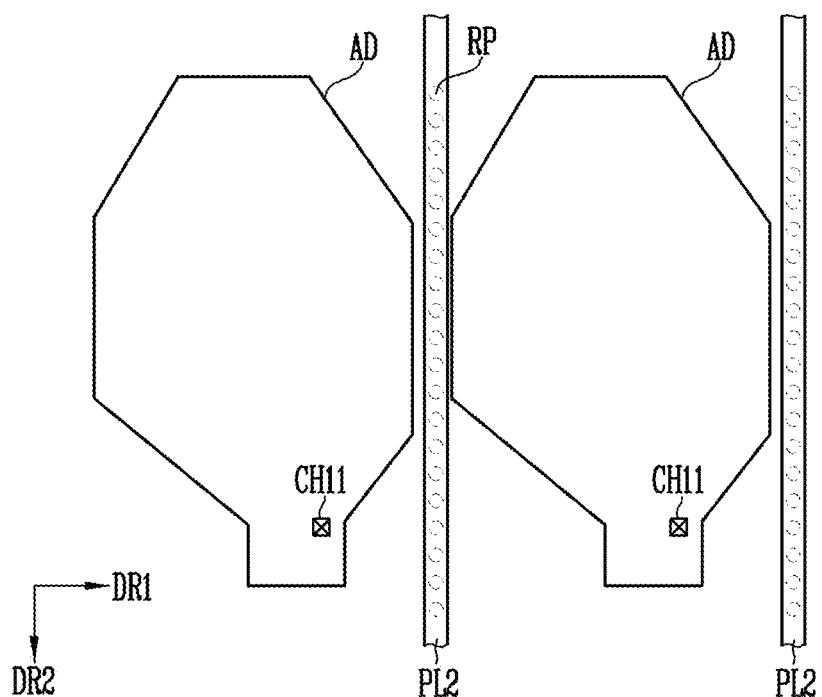

FIG. 14 is an enlarged view of region EA1 in FIG. 1 according to an exemplary embodiment of the present invention. FIGS. 15A to 15F are layout views schematically showing an element of a pixel shown in FIG. 14 by layer according to an exemplary embodiment of the present invention. For convenience of explanation, a further description of elements previously described may be omitted herein, and differences from the exemplary embodiments previously described will be primarily described herein. Herein, the same numerals denote the same elements, and similar numerals denote similar elements.

For convenience of illustration, on the basis of the first and second pixels PXL1 and PXL2 disposed in the i-th row, FIGS. 14 and 15A-15F show scan lines Si−1, Si, and Si+1 connected to the first and second pixels PXL1 and PXL2, an emission control line Ei, the first and second power supply lines PL1 and PL2, and data line Dj.

Referring to FIGS. 1, 14, and 15A to 15F, in an exemplary embodiment, a semiconductor pattern of each of the first and second pixels PXL1 and PXL2 is disposed on the substrate SUB. The semiconductor pattern may include the first to seventh active patterns ACT1 to ACT7, the first to seventh source electrodes SE1 to SE7, and the first to seventh drain electrodes DE1 to DE7. The first to seventh active patterns ACT1 to ACT7, the first to seventh source electrodes SE1 to SE7 and the first to seventh drain electrodes DE1 to DE7 may be disposed on the same layer and may be formed through the same process.

The scan lines Si−1, Si, and Si+1, the emission control line Ei, the lower electrode LE of the storage capacitor Cst, and the first to seventh gate electrodes GE1 to GE7 may be disposed on the gate insulation layer (see GI in FIG. 6) on the semiconductor pattern. The scan lines Si−1, Si, and Si+1, the emission control line Ei, the lower electrode LE, and the first to seventh gate electrodes GE1 to GE7 may be disposed on the same layer and may be formed through the same process.

The upper electrode UE of the storage capacitor Cst and an initialization power supply line IPL may be disposed on the first insulation layer (see IL1 in FIG. 6) on the scan lines Si−1, Si, and Si+1, the emission control line Ei, the lower electrode LE, and the first to seventh gate electrodes GE1-GE7.

The data lines Dj and Dj+1, the first power supply line PL1, the auxiliary connection line AUX, and the first and second connection lines CNL1 and CNL2 may be disposed on the upper electrode UE and the second insulation layer (see IL2 in FIG. 6) on the initialization power supply line IPL. The data lines Dj and Dj+1, the first power supply line PL1, the auxiliary connection line AUX, and the first and second connection lines CNL1 and CNL2 may be disposed on the same layer and may be formed through the same process.

The data lines Dj and Dj+1 may be connected to the second source electrode SE2 of the corresponding pixel of the first and second pixels PXL1 and PXL2 through the sixth contact hole CH6. The first power supply line PL1 may be connected to the upper electrode UE of the corresponding pixel of the first and second pixels PXL1 and PXL2 through the third and fourth contact holes CH3 and CH4.

The first connection line CNL1 may be connected to the first gate electrode GE1 of the corresponding pixel of the first and second pixels PXL1 and PXL2 through the first contact hole CH1. In addition, the first connection line CNL1 may be electrically connected to the third drain electrode DE3 and the fourth drain electrode DE4 of the corresponding pixel of the first and second pixels PXL1 and PXL2 through the second contact hole CH2.

The auxiliary connection line AUX may be connected to the seventh drain electrode DE7 of the corresponding pixel of the first and second pixels PXL1 and PXL2 through the ninth contact hole CH9. In addition, the auxiliary connection line AUX may be connected to the initialization power supply line IPL of the corresponding pixel of the previous pixel row through the eighth contact hole CH8. The second connection line CNL2 may be electrically connected to the sixth drain electrode DE6 and the seventh source electrode SE7 of the corresponding pixel of the first and second pixels PXL1 and PXL2 through a seventh contact hole CH7.

A bridge pattern BRP may be disposed on the third insulation layer (see IL3 in FIG. 6) on the data lines Dj and Dj+1, the first power supply line PL1, the auxiliary connection line AUX, and the first and second connection line CNL1 and CNL2.

The bridge pattern BRP may be connected to the second connection line CNL2 of the corresponding pixel of the first and second pixels PXL1 and PXL2 through the tenth contact hole CH10.

The first electrode AD and the second power supply line PL2 may be disposed on the passivation layer (see PSV in FIG. 6) on the bridge pattern BRP.

The first electrode AD may be connected to the bridge pattern BRP of the corresponding pixel of the first and second pixels PXL1 and PXL2 through an eleventh contact hole CH11, which passes through the passivation layer PSV. The first electrode AD may be finally connected to the sixth drain electrode DE6 and the seventh source electrode SE7 of the corresponding pixel.

The second power supply line PL2 may be spaced apart from the first electrode AD by a predetermined distance such that it does not overlap the first electrode AD. The second power supply line PL2 may include a plurality of uneven patterns RP extending in a second direction DR2 and disposed in an extended longitudinal direction in a plane view. The uneven patterns RP irregularly reflect the light incident on the first and second pixels PXL1 and PXL2 from the outside.

The display device according to an exemplary embodiment of the present invention may be used as various electronic devices by, for example, applying a touch sensor as an input device.

Figure 16:
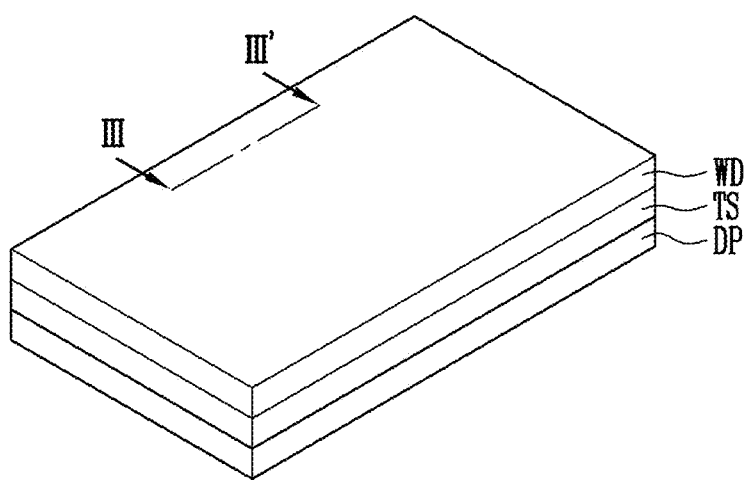
FIG. 16 is a perspective view schematically showing a form in which a touch sensor is applied to a display device of FIG. 1 according to an exemplary embodiment of the present invention.
Figure 17:
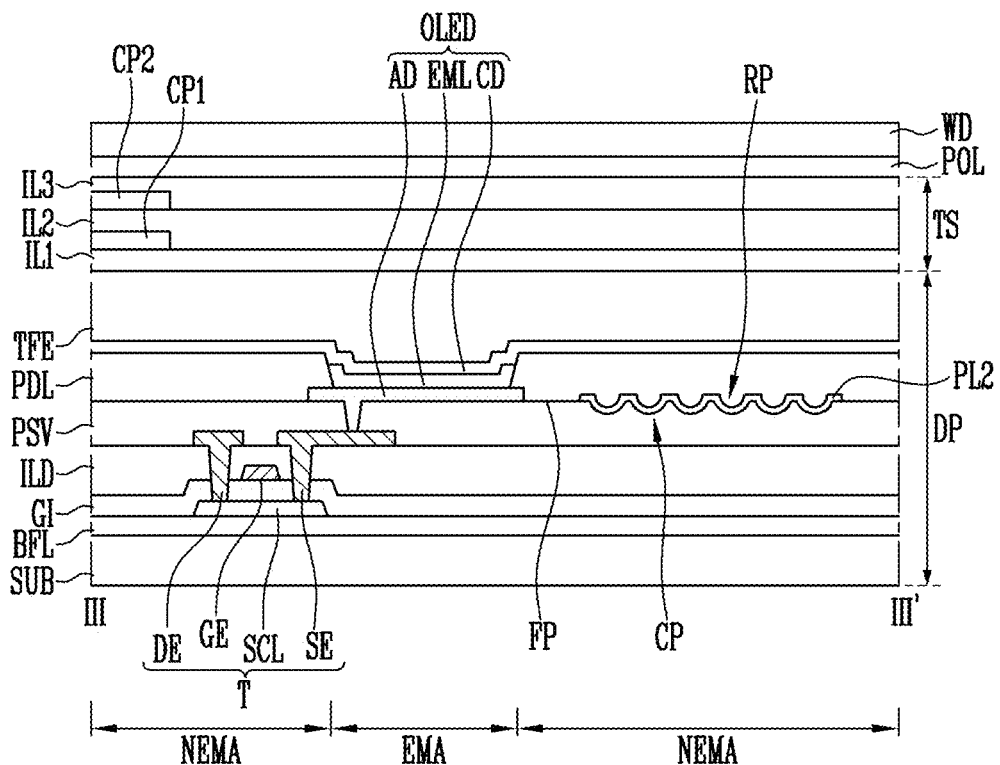
FIG. 17 is a cross-sectional view taken along line III-III' of FIG. 16 according to an exemplary embodiment of the present invention.

FIG. 16 is a perspective view schematically showing a form in which a touch sensor is applied to a display device of FIG. 1 according to an exemplary embodiment of the present invention. FIG. 17 is a cross-sectional view taken along line III-III' of FIG. 16 according to an exemplary embodiment of the present invention.

Referring to FIGS. 1, 16 and 17, a display device according to an exemplary embodiment of the present invention may be provided in various shapes including, for example, a quadrangular plate having two pairs of sides parallel to each other. When the display device is provided in a rectangular plate, one of two pairs of sides may be provided longer than the other pair of sides.

The display device may include a display panel DP, a touch sensor TS, and a window WD.

The display panel DP displays an image. The display panel DP may include, for example, a self-luminous display panel such as an organic light emitting display panel (e.g., OLED panel), a non-luminous display panel such as a liquid crystal display panel (LCD panel), an electrophoretic display panel (EPD panel), and an electro-wetting display panel (EWD panel). When the non-luminous display panel is used as the display panel DP, the display device may include a back-light unit for supplying light to the display panel DP.

In the following exemplary embodiment, the organic light emitting display panel will be described as an example of the display panel DP.

The display panel DP includes a substrate SUB on which a plurality of pixels PXL are disposed.

The substrate SUB includes a display region DA in which an image is displayed and a non-display region NDA in which the image is not displayed. In addition, the substrate SUB includes an emission region EMA through which light is emitted and a non-emission region NEMA through which the light is not emitted.

A transistor T, a light emitting element OLED connected to the transistor T, and a thin film encapsulation film TFE covering the light emitting element OLED may be disposed on the substrate SUB.

The transistor T may be connected to a scan line and a data line. The transistor T may include a semiconductor layer SCL, a gate electrode GE, a source electrode SE, and a drain electrode DE.

The semiconductor layer SCL may be disposed on the buffer layer BFL. In the semiconductor layer SCL, a region connected to the source electrode SE and the drain electrode DE may be a source region and a drain region doped or implanted with impurity. A region between the source region and the drain region may be a channel region.

The gate electrode GE may be disposed on the semiconductor layer SCL with a gate insulation layer GI interposed therebetween.

The source electrode SE and the drain electrode DE may be disposed on the gate electrode GE with an interlayer insulation layer ILD interposed therebetween. The source electrode SE may be connected to the source region through a contact hole passing through the interlayer insulation layer ILD, and the drain electrode DE may be connected to the drain region through a contact hole passing through the interlayer insulation layer ILD.

A passivation layer PSV may be disposed on the transistor T. In an exemplary embodiment, the passivation layer PSV includes at least one concave pattern CP corresponding to a portion of the non-emission region NEMA. In addition, the passivation layer PSV includes a remaining region of the non-emission region NEMA in which the concave pattern CP is not disposed, and a flat portion FP in the emission region EMA. The passivation layer PSV including the concave pattern CP and the flat portion FP may have a structure in which a portion of a surface thereof is curved.

The first electrode AD connected to the transistor T, and the second power supply line PL2 spaced apart from the first electrode AD, are disposed on the passivation layer PSV. In an exemplary embodiment of the present invention, the first electrode AD and the second power supply line PL2 are disposed on the same layer and include the same material.

In an exemplary embodiment, the second power supply line PL2 is disposed in the non-emission region NEMA and has a shape corresponding to a curved structure of the passivation layer PSV. In an exemplary embodiment, the second power supply line PL2 includes an uneven pattern RP corresponding to the concave pattern CP.

A pixel definition layer PDL including an opening that exposes a portion of the upper surface of the first electrode AD may be disposed on the first electrode AD and the second power supply line PL2. An emission layer EML may be disposed on the exposed surface of the first electrode AD, and the second electrode CD may be disposed on the emission layer EML.

The thin film encapsulation film TFE may be disposed on the second electrode CD.

The touch sensor TS may be disposed on at least one surface of the display panel DP. For example, the touch sensor TS may be disposed on a surface of the display panel DP in a direction in which the image of the display panel DP is emitted to receive a user's touch input. In addition, the touch sensor TS may be formed integrally with the display panel DP. In an exemplary embodiment of the present invention, a case where the touch sensor TS is disposed on the upper surface of the display panel DP will be described as an example.

The touch sensor TS can recognize a touch event from the display device by using a user's hand or a separate input means. In an exemplary embodiment of the present invention, the touch sensor TS may be driven by a mutual-capacitance method or a self-capacitance method.

The touch sensor TS may include conductive patterns CP1 and CP2 for touch sensing and the first to third insulation layers IL1, IL2 and IL3.

In an exemplary embodiment of the present invention, the conductive patterns CP1 and CP2 may include the first conductive pattern CP1 and the second conductive pattern CP2 disposed on different layers with the second insulation layer IL2 interposed therebetween. One of the first conductive pattern CP1 and the second conductive pattern CP2 may receive a touch driving signal through a sensing line, and the other one of the first conductive pattern CP1 and the second conductive pattern CP2 may transfer a touch sensing signal to an external driver through the sensing line. For example, the first conductive pattern CP1 may transmit the touch sensing signal and the second conductive pattern CP2 may receive the touch driving signal. In an exemplary embodiment of the present invention, the first and second conductive patterns CP1 and CP2 are shown as being disposed at different layers. However, the present invention is not limited thereto. For example, the first and second conductive patterns CP1 and CP2 may be disposed on the same layer.

The first insulation layer IL1 may be an inorganic insulation layer disposed on the uppermost layer of the thin film encapsulation film TFE. The second insulation layer IL2 may be disposed on the first insulation layer IL1 on which the first conductive pattern CP1 is disposed. The second insulation layer IL2 may include the same material as the first insulation layer IL1. However, the present invention is not limited thereto. The third insulation layer IL3 may be disposed on the second insulation layer IL2 on which the second conductive pattern CP2 is disposed. The third insulation layer IL3 may prevent the second conductive pattern CP2 from being exposed to the outside, thereby preventing corrosion of the second conductive pattern CP2.

The window WD may be disposed on the touch sensor TS and covers the touch sensor TS.

The window WD may be made of a transparent material. The window WD may protect the exposed surface of the touch sensor TS. The window WD transmits an image emitted from the display panel DP and simultaneously mitigates an impact from the outside, thereby preventing the display panel DP and the touch sensor TS from being damaged or from malfunctioning. Herein, the term "impact from the outside" refers to external power such as, for example, a pressure, a stress, etc., which may cause defects in the display panel DP and the touch sensor TS. An entire portion or at least one portion of the window WD may have flexibility.

A polarization film POL may be disposed between the touch sensor TS and the window WD. The polarization film POL may have a polarization axis and may linearly polarize light in a direction perpendicular to the polarization axis. For example, the polarization film POL may absorb light parallel to the polarization axis, and may transmit light perpendicular to the polarization axis. Therefore, when the light passes through the polarization film POL, the light may be linearly polarized in a direction perpendicular to the polarization axis.

The above-described polarization film POL may absorb light parallel to the polarization axis of light that is incident on the display device from the outside and then is reflected in the display device, thereby reducing the external-light reflectance of the display device.

In an exemplary embodiment of the present invention, the second power supply line PL2 has an uneven and curved shape, for example, a rugged shape, due to the uneven pattern RP. In this case, the light incident on the display device from the outside may be irregularly reflected by the uneven pattern RP of the second power supply line PL2 in the non-emission region NEMA. The irregular reflection of the external light generated in the non-emission region NEMA may be canceled by destructive interference with the reflection of the external light generated in the emission region EMA. Therefore, the display device according to an exemplary embodiment of the present invention may improve a black display capability by reducing a reflectance of the external light and increasing a contrast ratio.

Figure 18:
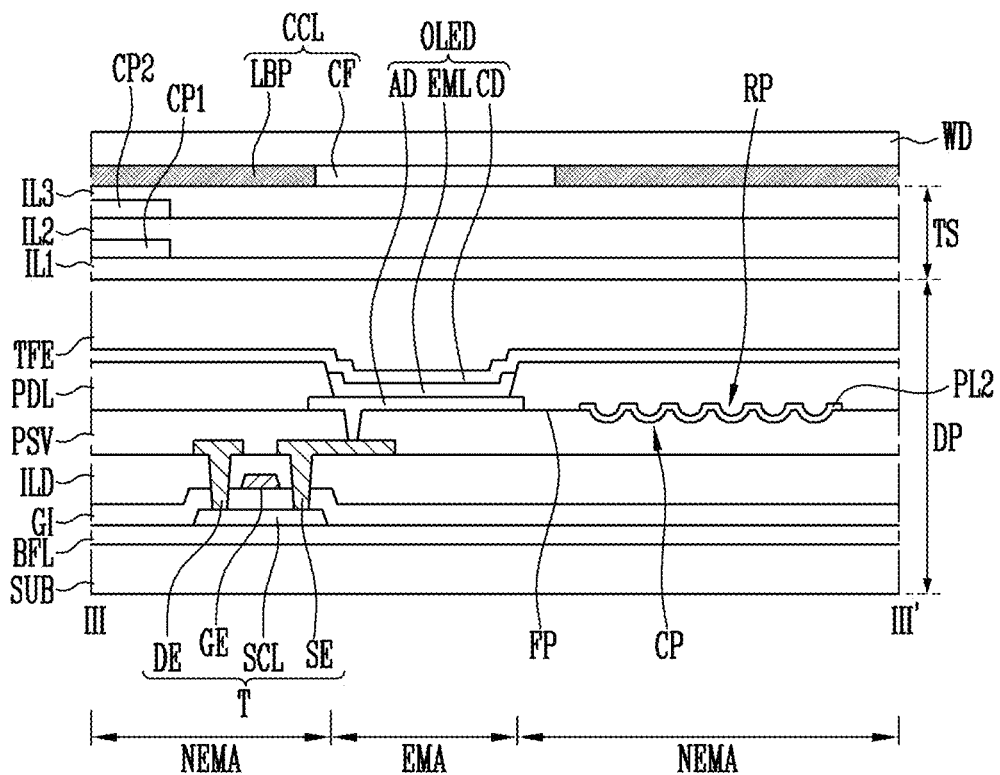
FIG. 18 is a cross-sectional view taken along line III-III' of FIG. 16 according to an exemplary embodiment of the present invention.

FIG. 18 is a cross-sectional view taken along line III-III' of FIG. 16 according to an exemplary embodiment of the present invention. For convenience of explanation, differences from the above-described embodiment will be primarily described herein. The same numerals denote the same elements, and similar numerals denote similar elements.

Referring to FIGS. 16 and 18, a display device according to an exemplary embodiment of the present invention includes a display panel DP, a touch sensor TS disposed on the display panel DP, a color conversion layer CCL disposed on the touch sensor TS, and a window WD disposed on the color conversion layer CCL.

The display panel DP may include a substrate SUB, a transistor T disposed on the substrate SUB, a light emitting element OLED connected to the transistor T, and a thin film encapsulation film TFE covering the light emitting element OLED.

The substrate SUB may include an emission region EMA through which light is emitted and a non-emission region NEMA through which the light is not emitted. The substrate SUB may further include a passivation layer PSV disposed between the transistor T and the light emitting element OLED.

In an exemplary embodiment, the passivation layer PSV includes a concave pattern CP in the non-emission region NEMA. Therefore, the passivation layer PSV may have a structure in which a portion of a surface thereof is curved. The second power supply line PL2 is disposed on the passivation layer PSV of the non-emission region NEMA. The second power supply line PL2 has a shape corresponding to a curved structure of the passivation layer PSV. For example, the second power supply line PL2 may include an uneven pattern RP corresponding to the concave pattern CP. The second power supply line PL2 including the uneven pattern RP may have a curved surface shape. Therefore, the light introduced from the outside to the display device may be irregularly reflected at the surface of the second power supply line PL2.

The touch sensor TS may be disposed on at least one of both surfaces of the display panel DP, and may sense a user's touch by using the conductive patterns CP1 and CP2.

The color conversion layer CCL may include a color filter CF for emitting light of a specific color for each pixel PXL and a light blocking pattern LBP disposed between the color filters CF. The color filter CF may be disposed in the emission region EMA, and the light blocking pattern LBP may be disposed in the non-emission region NEMA.

The light blocking pattern LBP may prevent color mixture of the adjacent color filters CF and absorb the light incident from the outside on the display device to block the light from entering elements disposed under the light blocking pattern LBP, for example, the transistor T and the light emitting element OLED. In addition, even if the light incident from the outside is reflected by the transistor T and the light emitting element OLED, a portion of the light may be absorbed by the light blocking pattern LBP. The light blocking pattern LBP may include a black matrix.

In an exemplary embodiment of the present invention, the color conversion layer CCL may have flexibility. Therefore, since the color conversion layer CCL is applied to the display device instead of the polarization film (see POL in FIG. 17) having low flexibility, the display device may have larger flexibility. In addition, the color conversion layer CCL may block the light incident on the display device from the outside by using the light blocking pattern LBP, thereby reducing the external-light reflectance of the display device.

In addition, the light incident on the display device from the outside may be irregularly reflected by the uneven pattern RP of the second power supply line PL2 in the non-emission region NEMA. The irregular reflection of the external light generated in the non-emission region NEMA may be canceled by destructive interference with the reflection of the external light generated in the emission region EMA. Therefore, the display device according to an exemplary embodiment of the present invention may reduce a reflectance of the external light.

The display device according to an exemplary embodiment of the present invention may be applied to various electronic devices. For example, the display device may be applied to a television, a notebook, a mobile phone, a smartphone, a tablet computer, a portable media player (PMP), a personal digital assistant (PDA), a navigation device, various wearable devices such as a smartwatch, etc.

While the present invention has been particularly shown and described with reference to the exemplary embodiments thereof, it will be understood by those skilled in the art that various changes in form and detail may be made therein without departing from the spirit and scope of the present invention as defined by the following claims.

What is claimed is:

1. A display device, comprising:
a substrate comprising a display region and non-display region;
at least one pixel disposed in the display region,
wherein the at least one pixel comprises an emission region that emits a light, a non-emission region that does not emit the light, a light emitting element disposed in the emission region and comprising a pixel definition layer, and a pixel circuit that drives the light emitting element;
a passivation layer disposed between the pixel circuit and the light emitting element,
wherein the passivation layer covers the pixel circuit, and comprises a concave pattern disposed in the non-emission region and having a recessed shape facing away from the substrate,
wherein a rounded bottom of the concave pattern is concave into the passivation layer; and
a power supply line disposed on the passivation layer in the non-emission region and connected to the light emitting element,
wherein the power supply line comprises an uneven pattern corresponding to the concave pattern,
wherein the power supply line is electrically connected to the light emitting element through a via hole that passes through the pixel definition layer.

2. The display device of claim 1, wherein the light emitting element comprises:
a first electrode disposed on the passivation layer in the emission region, wherein the first electrode is electrically connected to the pixel circuit,
wherein the pixel definition layer exposes a portion of the first electrode;
an emission layer disposed on the exposed first electrode; and
a second electrode disposed on the emission layer.

3. The display device of claim 2, wherein the power supply line is electrically connected to the second electrode through the via hole that passes through the pixel definition layer.

4. The display device of claim 3, wherein the pixel circuit comprises at least one transistor, and the at least one transistor comprises:
an active pattern disposed on the substrate;
a source electrode and a drain electrode respectively connected to the active pattern; and
a gate electrode disposed on the active pattern, wherein a gate insulation layer is disposed between the gate electrode and the active pattern.

5. The display device of claim 4, wherein the concave pattern has the recessed shape in a direction from one surface of the passivation layer to an opposite surface of the passivation layer under which the at least one transistor is disposed, and the uneven pattern has a shape corresponding to the concave pattern.

6. The display device of claim 5, wherein a width of the concave pattern is between about 1.2 μm and about 2 μm, and a depth of the concave pattern is between about 0.3 μm and about 0.5 μm.

7. The display device of claim 5, wherein the passivation layer comprises a flat portion in the emission region.

8. The display device of claim 2, wherein the uneven pattern causes an irregular reflection of an external light incident on the light emitting element.

9. A display device, comprising:
a substrate comprising a display region and a non-display region disposed on at least one side of the display region;
at least one pixel disposed in the display region,
wherein the at least one pixel comprises an emission region that emits a light, a non-emission region that does not emit the light, a light emitting element disposed in the emission region and comprising a pixel definition layer, and a pixel circuit that drives the light emitting element;
a passivation layer disposed on the pixel circuit;
a power supply line disposed on the passivation layer in the non-emission region and connected to the light emitting element;
a thin film encapsulation layer disposed on the light emitting element;
a touch sensor disposed on the thin film encapsulation layer; and
a window disposed on the touch sensor,
wherein the power supply line comprises an uneven pattern having a recessed shape facing away from the substrate that causes an irregular reflection of an external light incident on the light emitting element,
wherein a rounded bottom of the uneven pattern is concave into the passivation layer, wherein the power supply line is electrically connected to the light emitting element through a via hole that passes through the pixel definition layer.

10. The display device of claim 9, wherein the uneven pattern has the recessed shape in a direction from one surface of the power supply line to an opposite surface of the power supply line under which the pixel circuit is disposed.

11. The display device of claim 10, wherein the light emitting element comprises:
a first electrode disposed on the passivation layer in the emission region, wherein the first electrode is electrically connected to the pixel circuit;
the pixel definition layer disposed on the first electrode and exposing a portion of the first electrode;
an emission layer disposed on the first electrode; and
a second electrode disposed on the emission layer,
wherein the power supply line is electrically connected to the second electrode through the via hole that passes through the pixel definition layer.

12. The display device of claim 11, wherein a width of the uneven pattern is between about 1.2 μm and about 2 μm.

13. The display device of claim 11, wherein the passivation layer comprises:
a flat portion disposed in the emission region; and
a concave pattern disposed in the non-emission region and corresponding to the uneven pattern of the power supply line.

14. The display device of claim 9, further comprising:
a polarization film disposed between the touch sensor and the window.

15. The display device of claim 9, further comprising:
a color conversion layer disposed between the touch sensor and the window, wherein the color conversion layer converts the light emitted from the light emitting element into a specific color of light.

16. The display device of claim 15, wherein the color conversion layer comprises a color filter disposed in the emission region, and a light blocking pattern disposed in the non-emission region.

17. A method of manufacturing a display device, comprising:
forming a pixel circuit on a substrate, wherein the pixel circuit comprises at least one transistor;
forming a passivation layer on the pixel circuit,
wherein the passivation layer comprises a through hole that exposes a portion of the pixel circuit, and a concave pattern disposed on the pixel circuit and having a recessed shape facing away from the substrate,
wherein a rounded bottom of the concave pattern is concave into the passivation layer,
wherein forming the passivation layer comprising coating an insulating material layer on the pixel circuit, and exposing and developing a portion of the insulating material layer to form a through hole and the concave pattern simultaneously;
forming a first electrode connected to the at least one transistor;
forming a power supply line spaced apart from the first electrode on the passivation layer;
forming a pixel definition layer that exposes a portion of the first electrode on the first electrode and the power supply line;
forming an emission layer that emits a light on the first exposed electrode;
forming a second electrode on the emission layer; and
forming a thin film encapsulation layer on the second electrode,
wherein the power supply line is disposed on the passivation layer in a non-emission region that excludes the emission layer, and comprises an uneven pattern corresponding to the concave pattern of the passivation layer,
wherein the light is not emitted in the non-emission region.

18. The method of claim 17, wherein the concave pattern has the recessed shape in a direction from one surface of the passivation layer to an opposite surface of the passivation layer under which the at least one transistor is disposed, and the uneven pattern has a shape corresponding to the concave pattern.

19. The method of claim 18, wherein a width of the concave pattern is between about 1.2 μm and about 2 μm, and a depth of the concave pattern is between about 0.3 μm and about 0.5 μm.

* * * * *